US008234398B2

(12) United States Patent
Vonog et al.

(10) Patent No.: US 8,234,398 B2
(45) Date of Patent: Jul. 31, 2012

(54) METHOD AND SYSTEM FOR LOW-LATENCY TRANSFER PROTOCOL

(75) Inventors: Stanislav Vonog, San Francisco, CA (US); Nikolay Surin, San Francisco, CA (US); Vadim Shtayura, San Francisco, CA (US)

(73) Assignee: Net Power and Light, Inc., San Francisco, CA (US)

( * ) Notice: Subject to any disclaimer, the term of this patent is extended or adjusted under 35 U.S.C. 154(b) by 0 days.

(21) Appl. No.: 13/316,816

(22) Filed: Dec. 12, 2011

(65) Prior Publication Data

US 2012/0084456 A1 Apr. 5, 2012

Related U.S. Application Data

(63) Continuation of application No. 12/569,876, filed on Sep. 29, 2009.

(51) Int. Cl.
*G06F 15/16* (2006.01)
(52) U.S. Cl. ........................................................ 709/232
(58) Field of Classification Search .................. 709/232
See application file for complete search history.

(56) References Cited

U.S. PATENT DOCUMENTS

| 6,141,324 A | 10/2000 | Abbott et al. |
| 6,232,891 B1 | 5/2001 | Rosenberg |
| 7,516,255 B1 | 4/2009 | Hobbs |
| 7,693,345 B2 | 4/2010 | Pore et al. |
| 8,005,149 B2 * | 8/2011 | Lerner et al. ............. 375/240.26 |
| 2002/0149617 A1 | 10/2002 | Becker |
| 2006/0087512 A1 | 4/2006 | Schmieder et al. |
| 2006/0184614 A1 | 8/2006 | Baratto et al. |
| 2006/0282855 A1 | 12/2006 | Margulis |
| 2009/0189891 A1 | 7/2009 | Rivera et al. |
| 2011/0078532 A1 | 3/2011 | Vonog et al. |

OTHER PUBLICATIONS

Notice of Allowance Mailed Nov. 28, 2011 in Co-Pending U.S. Appl. No. 12/569,876 of Vonog, S., et al., filed Sep. 29, 2009.
Notice of Allowance Mailed Oct. 28, 2011 in Co-Pending U.S. Appl. No. 12/569,876 of Vonog, S., et al., filed Sep. 29, 2009.
Non-Final Office Action Mailed Jun. 22, 2011 in Co-Pending U.S. Appl. No. 12/569,876 of Vonog, S., et al., filed Sep. 29, 2009.
Co-Pending U.S. Appl. No. 12/569,876 of Vonog, S., et al., filed Sep. 29, 2009.
International Search Report and Written Opinion of PCT/US2010/050237 dated Jun. 28, 2011.

* cited by examiner

Primary Examiner — Asghar Bilgrami
(74) Attorney, Agent, or Firm — Perkins Coie LLP

(57) ABSTRACT

A method and system for providing computer-generated output and in particular graphical output. An output capturing and encoding engine is configured to intercept graphical output from an application on a server, organize the output into regions having similar motion and/or graphical characteristics, and convert the data from each region into a format suitable to balance transmission efficiencies versus display quality or capability at the receiving end.

11 Claims, 18 Drawing Sheets

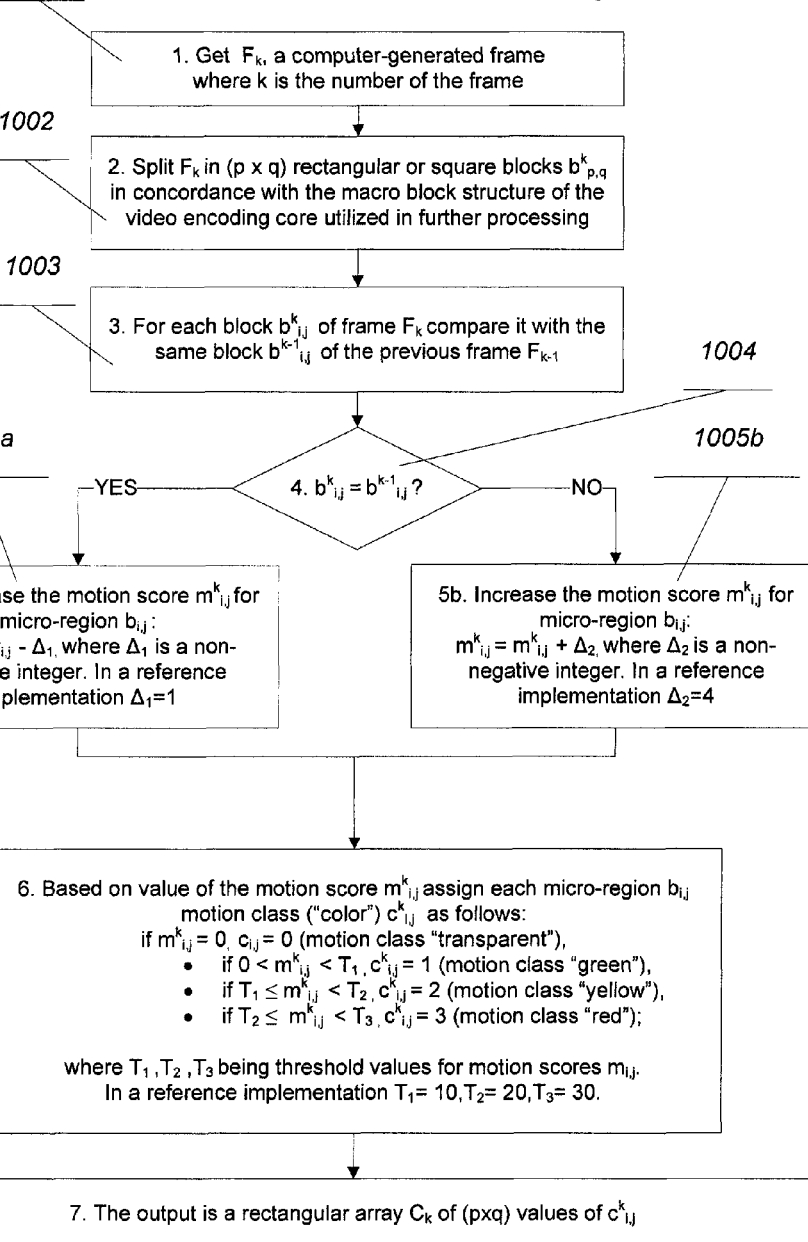

DATA Chunk 1506
for FEC channels

DATA Chunk 1504
for reliable and unreliable channels

PING_RESPONSE Chunk 1510

PING Chunk 1508

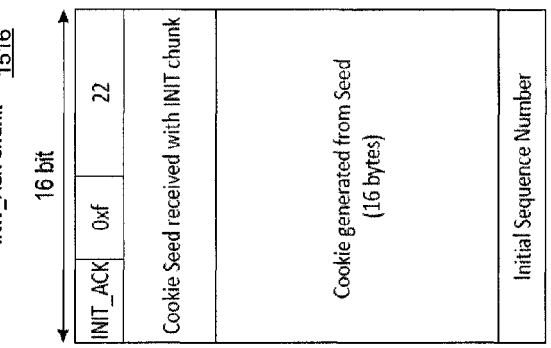
FIG. 15I
INIT_ACK Chunk  1516
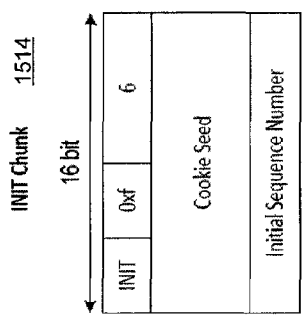
FIG. 15H
INIT Chunk  1514
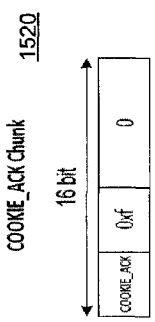
FIG. 15K
COOKIE_ACK Chunk  1520
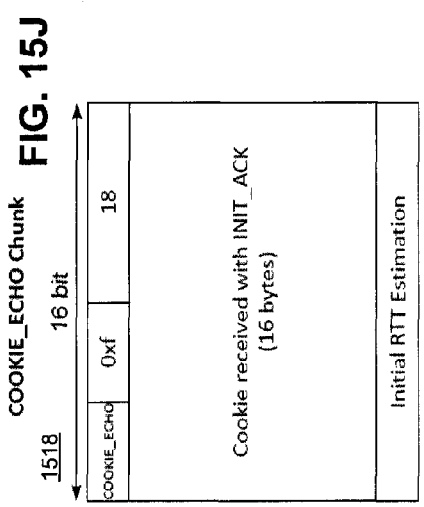
FIG. 15G
1512
FIG. 15J
COOKIE_ECHO Chunk  1518
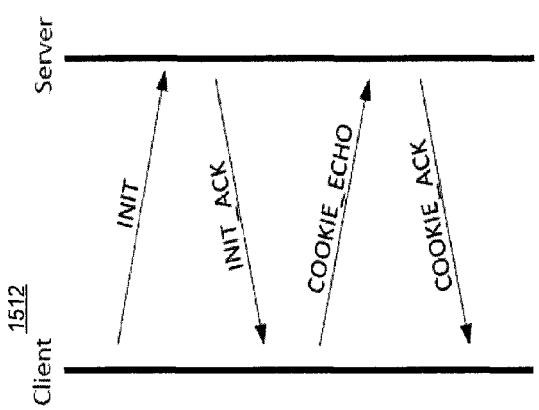

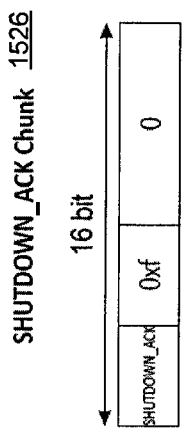
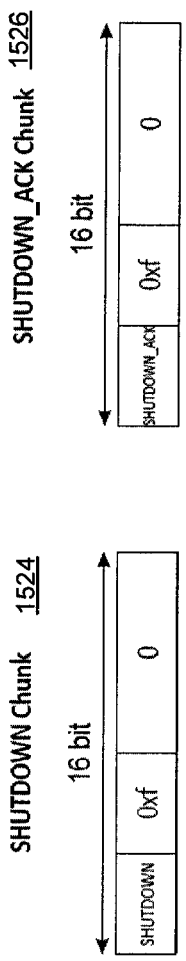
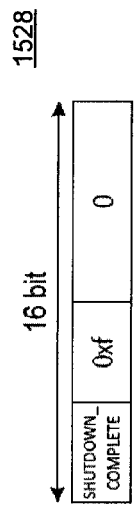
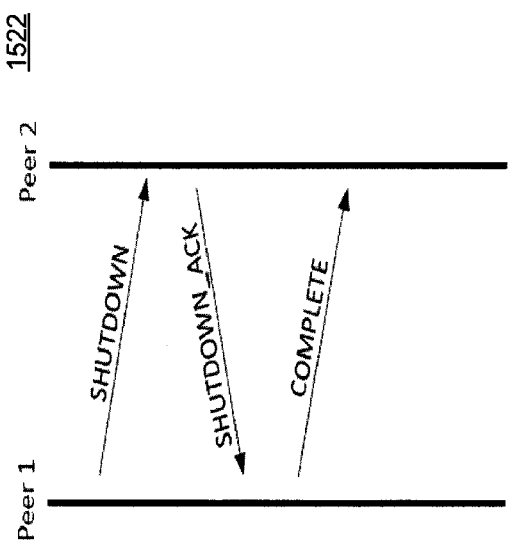
FIG. 15N — SHUTDOWN_ACK Chunk 1526
FIG. 15M — SHUTDOWN Chunk 1524
FIG. 15O — SHUTDOWN_COMPLETE Chunk 1528
FIG. 15L — 1522

METHOD AND SYSTEM FOR LOW-LATENCY TRANSFER PROTOCOL

CROSS-REFERENCE TO RELATED APPLICATIONS

This application is a continuation of co-pending U.S. patent application Ser. No. 12/569,876 entitled "METHOD AND SYSTEM FOR LOW-LATENCY TRANSFER PROTOCOL", filed Sep. 29, 2009, which is incorporated herein by reference.

BACKGROUND

Virtual Desktop Infrastructure (VDI) is a server-centric computing model that hosts and manages desktop virtual machines at a data center while providing end users a full PC desktop experience via thin clients over a network.

Some existing solutions add the ability to switch some incoming client sessions towards traditional shared desktop systems such as Microsoft's Terminal Services or Citrix's application servers, blade servers or even to individual unused physical desktop computers.

VDI solutions involve the remote execution of a Windows instance at a server that sends screen updates across the network to a client display device with a protocol such as RDP or ICA. However, prior protocols flush the video frame buffer to the client roughly once every 100 milliseconds, which is unsuitable for modern graphics-intensive applications and applications requiring audio-video synchronization.

There are several existing approaches of providing VDI solutions.

The "screen scrape" method includes "scrapping" graphical elements painted to the "screen" on the host by the protocol and sent to the client. In a first example, the client can contact the server and pull a new "snapshot" of the screen from the frame buffer. In a second example, the server can continuously push its screen activity to the client. This can be at the frame buffer level, the GDI/window manager level, or a combination of both. Both examples can utilize caching at the client for frequently used graphical elements.

The screen scrape method can be combined with "multimedia redirection," where server-side multimedia elements are sent in their native formats to the client devices. The client can then play the multimedia streams locally and dynamically insert them into the proper position on the screen.

This approach is suited if (1) the client has the technical capability and hardware to render the multimedia, and (2) the client has the proper codec installed to properly render the multimedia content. In effect, this means that the clients can't be "too thin."

Server graphics system virtualization "virtualizes" the graphics system of the host. Software on the host captures all possible graphical layers (GDI, WPF, DirectX, etc.) and renders them into a remote protocol stream (like RDP) sent to the client as fast as possible. This will give the client an experience which is very close to local performance, regardless of the client device (even on very low-end or thin clients).

Hardware acceleration on the server and client utilizes a special chipset on the host, which captures screen for transmission across the network. The client device has a matching special chipset for rendering.

The prior approaches discussed above addressing problems in remote display of graphical information over a network in real time fail to deliver low latency and acceptable level of quality and interactivity for highly dynamic graphics and full-motion video. Problems include:

Limited support for full-motion video.
    Significant inherent latency even when working over relatively short distances (WAN).
    Poor performance and quality in unreliable network environments with relatively high levels of packet loss, jitter and latency (e.g. Internet).
    Inability to prioritize traffic for latency and quality of user experience in presence of significant data streams in the network.
    Inconsistent synchronization of audio and video streams.
    Inability to handle a variety of inputs and outputs, such as full-body sensing, video, voice, sensors, motion—please add it all to the background.

The problems above are caused, in part, because existing solutions such as Microsoft RDP, Citrix ICA, AT&T's VNC, and others were designed before video and highly interactive rich graphical user interfaces were ubiquitous on users' computers.

Thus, there is a need for an improved transfer protocol for remote computing.

BRIEF DESCRIPTION OF DRAWINGS

The features and objects of the present disclosure will become more apparent with reference to the following description taken in conjunction with the accompanying drawings wherein like reference numerals denote like elements and in which:

FIG. 10 illustrates an example procedure executed by a server to provide a simple motion detector module.

FIG. 15G illustrates a handshake sequence.

FIG. 15H illustrates an example init chunk.

FIG. 15I illustrates an example init_ack chunk.

FIG. 15J illustrates an example cookie_echo chunk.

FIG. 15K illustrates an example cookie_ack chunk.

FIG. 15L illustrates an example connection shutdown sequence.

FIG. 15M illustrates an example shutdown chunk.

FIG. 15N illustrates an example shutdown_ack chunk.

FIG. 15O illustrates an example shutdown_complete chunk.

DETAILED DESCRIPTION

A method and system for low latency real-time transmission of computer-generated information to multiple interactive display devices over an unreliable packet-switched communication network is provided. The computer output information can be generated by an application executing on a server, such as graphical output, audio signals, data, USB interface signals, print spools, etc. The system enables interactive transmission of computer output information generated by the application to multiple end-user devices over the network. A wide range of end-user devices can be supported by the system, from low-cost thin clients to high-powered workstations, where each end-user device has a different amount of available bandwidth. Multiple users can simultaneously interact with the same graphical information on the end-user devices.

The system transmits interaction data captured at the end-user devices back to the server and synchronizes the inputs for processing by the application. The system then captures the graphical and other types of output of the server and applies various encoding schemes to encode and transmit the output information to the end-user devices.

The system utilizes design assumptions and goals (low latency, full-motion video, unreliable networks, relatively high network bandwidth, etc.) that differ significantly from those of existing systems. A similar approach was used in a distributed multiplayer real-time jamming system requiring transmission of multiple high quality audio streams over the Internet at extremely low latencies (below 50 ms) and precise synchronization of these streams. This approach is discussed in various references, including:

U.S. patent application Ser. No. 11/717,606 entitled "Method and System for Low Latency High Quality Music Conferencing" filed Mar. 13, 2007, claiming priority to U.S. Provisional Application No. 60/785,145 entitled "Method and system for low latency high quality music conferencing" filed Mar. 22, 2006.

"Virtual Jamming. Four Fixes for the Major Problem Facing Musicians Who Play Together on the Web: Lag" http://www.spectrum.ieee.org/computing/software/virtual-jamming (last retrieved Sep. 10, 2009); and U.S. patent application Ser. No. 12/024,089, entitled "Method and System for Precise Synchronization of Audio and Video Streams During a Distributed Communication Session With Multiple Participants" filed Jan. 31, 2008, claiming priority to U.S. Provisional Application No. 60/887,555 entitled "Method and System for Low Latency High Quality Music Conferencing" filed Jan. 31, 2007;

all of which are incorporated-by-reference.

Figure 1:
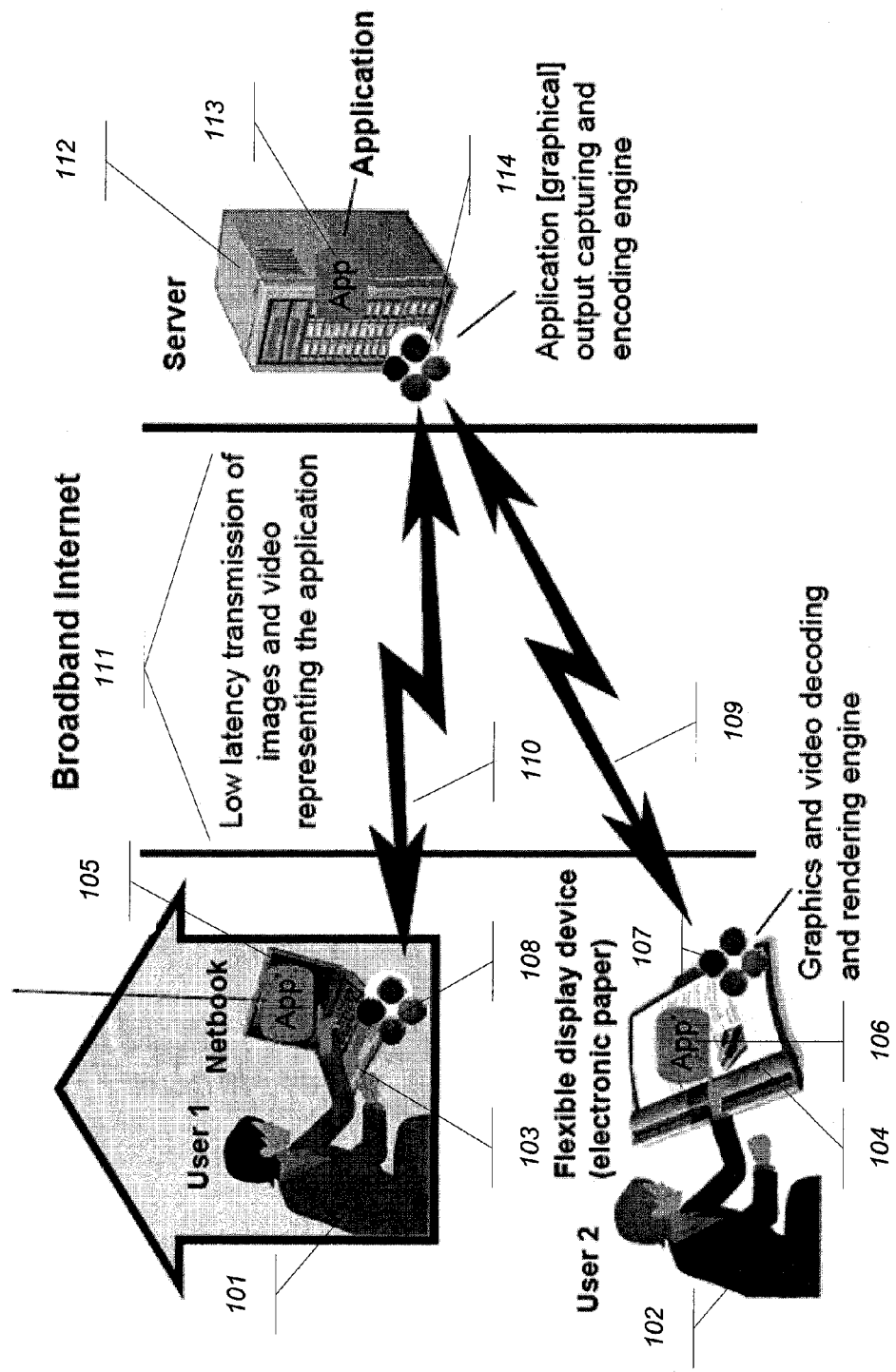
FIG. 1 illustrates an example system for providing an improved transfer protocol for remote computing.

FIG. 1 illustrates an example system for providing an improved transfer protocol for remote computing. The system can be geographically distributed and communicate over a broadband network, such as the Internet.

The system includes a physical or virtual server 112 which executes an instance of a software application 113 on an operating system. For example, the operating system can be Windows, Mac OS X, UNIX, Linux, etc.

The output of the application 113 is captured by the capturing and encoding engine 114, discussed below. For example, the output can be graphical output of a user interface provided by the application 113 on execution.

Other types of output can be captured by the engine 114. For example, audio output can be captured for encoding and transmission over the system.

Engine 114 executing on the server 112 captures and encodes the output of the application for transmission over a broadband network 111 using a low latency hybrid network stack, discussed below. For example, the network can be an IP-based network, cellular network, 3G or 4G wireless network, cable, etc.

The transmission can be relayed simultaneously to multiple receivers via multiple streams 109 and 110 over the network 111 using multicasting (if available) to decrease the load on the network. It will be appreciated that any number of receivers can be present in the system, subject to available bandwidth of the network 111. The system is configured to minimize latency to improve a user experience. For example, if a receiver has insufficient bandwidth (or if network congestion occurs), the system dynamically decreases a graphical quality and otherwise reduces a stream bandwidth to maintain low latency.

The example system includes two receivers: a netbook 103 and a flexible display device (electronic paper) 104. For example, the netbook 103 can be a low-cost computing device such as ASUS' Eee PC, based on Intel Atom CPU and Intel GMA 945 graphics acceleration chip. Similar netbooks can also be used.

Each receiver includes a graphics and video decoding and rendering engine (GVDR engine). The netbook 103 includes a software-based GVDR engine 108, executing on the netbook's 103 operating system. The flexible display includes a hardware GVDR engine 107 implemented as an integrated circuit or a chip set of DSPs, processing units, memory units, etc. It will be appreciated that other implementations of the GVDR can be used, depending on the needs of the user and the resources available. Alternatively, the video decoding and rendering engine can be an external hardware device, such as a USB device. One example embodiment can be a small TV box with network input and HDMI output. The network input can be connected to a wired network (cable, Ethernet, etc) or a wireless network (Wi-Fi, Etc.)

It will be appreciated that the GVDR engine is simple in implementation and can be built in a variety of ways for multiple computing platforms or consumer electronic devices. This allows a wide range of devices to function as receivers in the system.

The GVDR engines 107 and 108 render images 105 and 106 of the application 113 on each of the respective receiver systems 103 and 104. In addition, the GVDR engines 107 and 108 can render video data, audio data, and any other data captured as output from the application.

The images 105 and 106 are refreshed as necessary but the refresh rate can vary from 15 frames per second for certain regions of the picture to 60 frames per second or more using present-day display devices. It will be appreciated that higher frame rates are possible, depending on system resources and performance requirements. Higher frame rates can provide a more optimal user experience. In one embodiment, different regions of the images can be refreshed at different rates for improved user experience, as discussed below.

In one embodiment, the images 105 and 106 can be interactive. A variety of input data from users 101 and 102 interacting with devices 104 and 105 can be captured and sent back to the application 113. Input data includes keyboard strokes, mouse movements, touch and multitouch events, motion-sensing data, accelerometer data, sensor data such as temperature or condition of air, human biological sensors such as heart rate sensors, or blood sugar sensors, voice commands, eye movements, or neurological impulses to be interpreted by a computer, etc.

The input data can be transmitted to the engine 114, which aggregates and transmits the input data to the application 113. The application 113 can interpret the input data for processing, and alter its output responsive to the input data. The output is again captured by the engine 114 and transmitted through network 111 to receivers 103 and 104 as discussed above.

Alternatively, the engine 114 can interpret the input data for processing. For example, the engine 114 can map multi-touch events to application specific commands based on mapping scheme provided separately with the application 113. It will be appreciated that the input data can be interpreted by a combination of the application 113 and the engine 114.

In operation, users 101 and 102 are able to work together on the same application 113. This collaboration is a feature of the system, regardless of whether the application 113 includes multi-user support.

Furthermore, security and privacy issues such as firewall and network address translation (NAT) issues are eliminated. Users 101 and 102 initiate connections to the server 112, a trusted source. Therefore, the users 101 and 102 of the example system never accept unknown and untrusted network connections.

Figure 2:
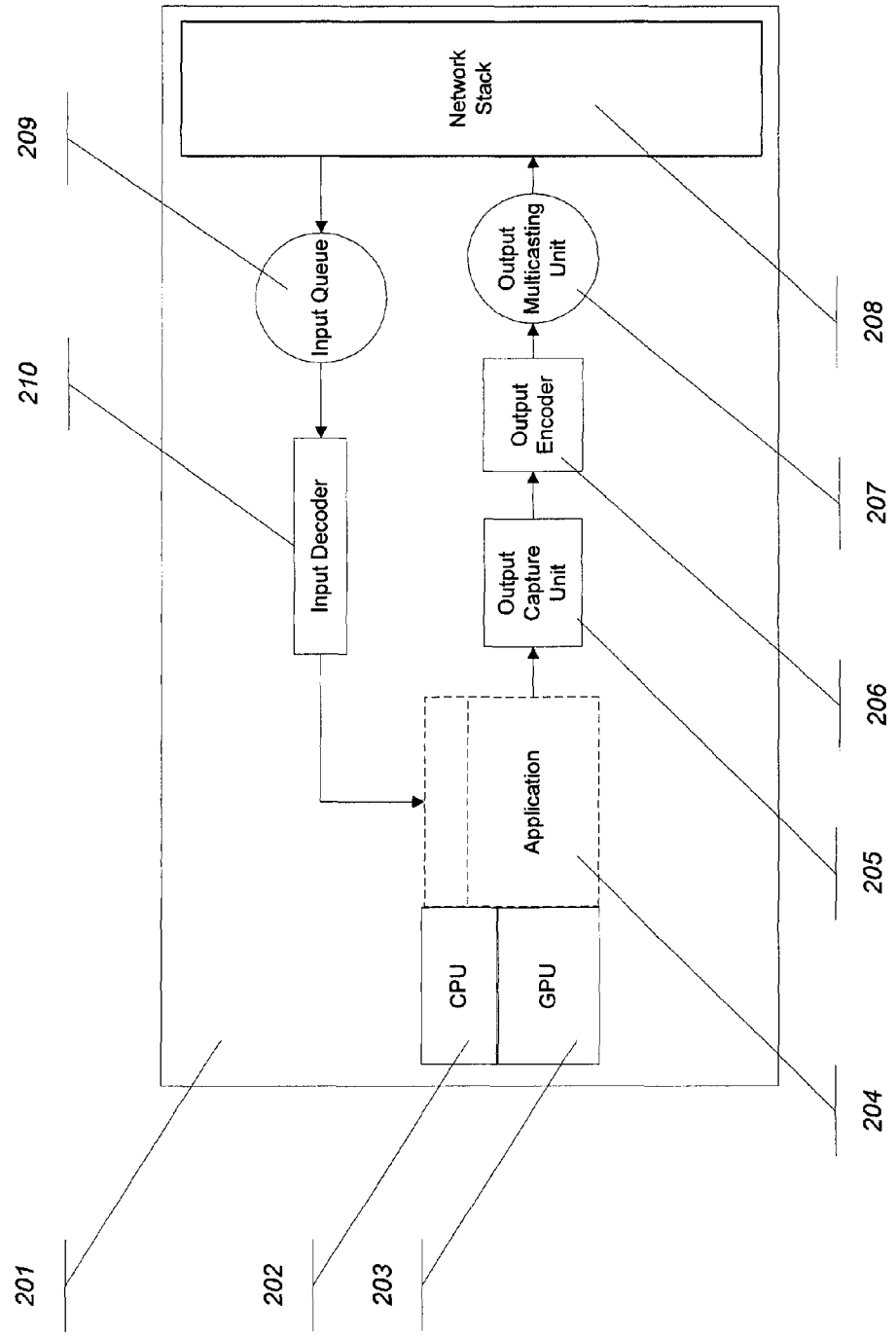
FIG. 2 illustrates an example server for providing an improved transfer protocol for remote computing.

FIG. 2 illustrates an example server for providing an improved transfer protocol for remote computing. A server 201 can execute the application and GVDR engine as discussed.

The server 201 can be physical or virtual, and includes a CPU 202 and optionally a GPU 203. The server 201 can include other processing hardware units, such as a sound card (not illustrated). For example, the CPU can be an Intel Core i7. For example, the GPU can be an Nvidia GeForce 9400.

Application 204 is running in a conventional operating system either within or without a hypervisor (OS and hypervisor are not illustrated). Example operating systems include Windows XP, Windows Vista, Windows 7, Windows Server, Windows Mobile, Mac OS X, Mac OS X Server, UNIX, Linux, Symbian, Android, etc.

Output capture component 205 captures output data from the application either in form of commands or raw data. Details of the capturing process are discussed below. For example, the component 205 can capture graphic API commands (such as GDI or Open GL commands, etc.), images from video memory with high frequency (20-60 Hz) and multimedia API commands (such as for showing video, etc.).

Output encoder 206 encodes the captured output data for transmission through a low latency hybrid network stack 208. Output multicasting unit 207 manages transmission to multiple receivers over a network and ensures that the transmission is synchronized among these multiple receivers. In addition, the output multicasting unit 207 ensures that appropriate output data is transmitted to each receiver. For example, different quality output data can be used for receivers with different bandwidth. In addition, receivers can vary by device rendering capabilities like max fps, Open GL hardware support, etc.

The multicasting unit 207 maintains receivers joining and leaving broadcasting sessions, defines optimal transmission topology and routing, maintains and re-arranges a multicast overlay network. The multicasting unit 207 also appends relevant synchronization data such as time stamps to outgoing packets, ensures the receivers' clocks are synchronized, and adjust—if necessary—for bit rates, encoding data, available network bandwidth, processing capabilities and latencies for each of the receivers participating in the communication session.

The multicasting unit 207 is in communication with the hybrid network stack 208 and output encoder 206 to efficiently perform the functionality discussed above. The multicasting unit 207 can utilize optimization criteria based on a quality of interaction and a user experience for users at the receiver devices. The network stack 208 interfaces with a physical network interface which sends packets of data to a physical communication network. The network stack 208 can be commonly implemented as a user-mode or kernel-mode software component. Alternatively it may be implemented as a hardware integrated circuit.

An input queue 209 is responsible for receiving input commands from multiple users, buffering the commands, and properly ordering the commands (thereby synchronizing the input data from multiple users.) Input decoder 210 ensures that different types of input data are understandable by the application 204. The input decoder 210 discards all input commands that cannot be interpreted by the application 204.

It will be appreciated that the outgoing capture unit 205, the output encoder 206, the output multicasting unit 207, the network stack 208, the input queue 209, and the input decoder 210 can be implemented as software programs running in kernel and user mode of the native operating system of the application 204. These features are further discussed below.

Figure 3:
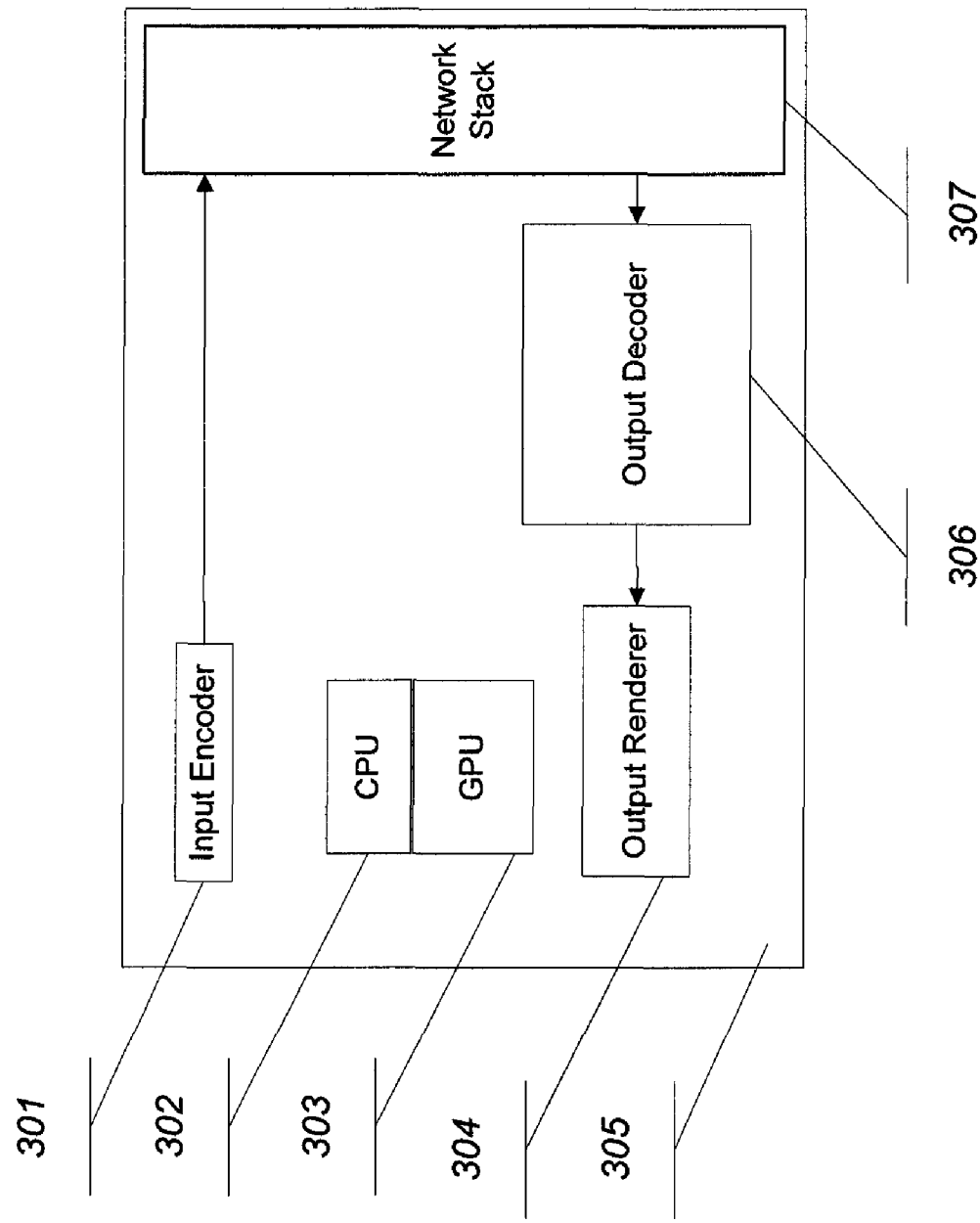
FIG. 3 illustrates an example client for providing an improved transfer protocol for remote computing.

FIG. 3 illustrates an example client for providing an improved transfer protocol for remote computing. A client display device 305 can be a receiver device as discussed above.

The client 305 includes a low latency hybrid network stack 307, an output decoder 306 and output renderer 307 present on the device. The output decoder can include audio/visual codecs, picture codecs, and graphic commands libraries to decode received output data.

The above components can be implemented as user-mode software programs running on a conventional operating system executing on a low-cost computing hardware platform which may include a CPU 302 and a GPU 303. For example, the CPU 302 can be an Intel Atom processor. For example, the GPU 303 can be an Intel GMA 945.

These components can also be implemented in hardware. In one embodiment, the client 301 does not require a general purpose CPU and a GPU, nor does it require a conventional operating system such as Windows XP, Windows Vista, Windows 7, Windows Server, Windows Mobile, Mac OS X, Mac OS X Server, UNIX, Linux, Symbian, Android, etc.

The client 305 can support input capabilities with an input encoder 301. The input encoder 301 and the output decoder 306 interface with the network stack 307 to receive graphical output data in the form of images, encoded video stream or graphics commands in an intermediate format from a remote server and reply with encoded input data. The output decoder 306 may receive and interpret other types of output such as audio or general data streams (such as files or streams of data). The input data can be encoded in device- and operating system-independent format by input encoder 301.

Figure 4:
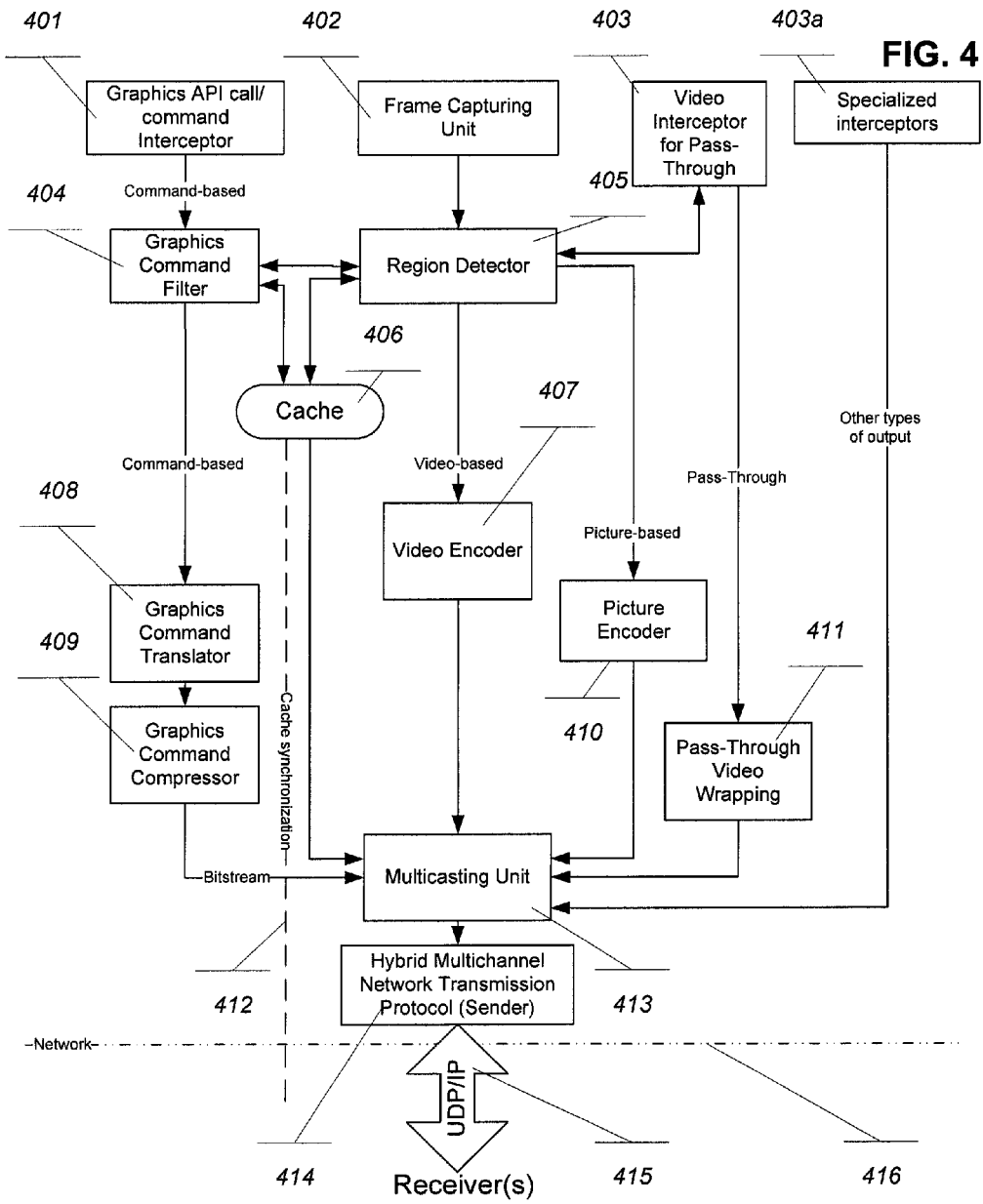
FIG. 4 illustrates an example output capture and encoding engine executing on a server for providing an improved transfer protocol for remote computing.

FIG. 4 illustrates an example output capture and encoding engine executing on a server for providing an improved transfer protocol for remote computing. The graphics output and encoding engine can capture graphical output of an application running on the server, as discussed above. The engine further encodes the output in a supported form (graphic API commands, picture, or video), then transmits the encoded output with the hybrid multi-channel network protocol stack according to the type and urgency of the data. The engine also updates the cache which synchronizes itself with other caches on receivers (if present).

Graphics API command interceptor 401, Frame Capturing Unit 402, and Video Pass-through Interceptor 403 capture graphical information generated by an application (or, optionally, an operating system that the application is running in). For example, the frame capturing unit 402 can capture graphical output at 20 to 30 frames per second. Higher frame rates are possible given sufficient processing capabilities and bandwidth.

Other interceptor components 403a may be present for interception of other types of output. Example output types include audio, 3D holograms, 3D objects, printer output, etc. as well as general data output in the form of data files and data streams.

For instance, low-latency interception of high-quality audio streams is described in "Method and System for Low Latency High Quality Music Conferencing", discussed above, can be incorporated.

Synchronization between various types of outputs can be achieved with various mechanisms. One mechanism is by time stamping (performed in multicasting unit 413, described below) on the sending side and keeping clocks on the sending and receiving side synchronized. Another mechanism is to implement jitter buffers on the receiving side, discussed below, which manage network latency by changing buffer sizes and discarding data portions as necessary. Another mechanism is changing data interpretation (such as audio sampling rate during replay) to achieve a desired level of synchronization.

The implementation of interceptors 401, 402, 403, and similar interceptors 403a may vary. They may be implemented as kernel-mode or user-mode software components running within an operating system. They may also be implemented as software components running on top of a hypervisor and present themselves as hardware components to virtualized instances of guest operating systems. They may also be implemented in hardware if the graphics capture and encoding engine is implemented as a hardware chip.

Graphics API command interceptor 401 captures graphics commands and API calls generated by the application. These commands may include, for example, Microsoft's GDI, Direct 3D, Open GL, Desktop Window Manager, and Apple's QuickDraw, Quartz 2D, PostScript, Core Image, Core Animation, Quartz Compositor, etc. The interceptor 401 may be implemented as a virtual display driver in a combination with a user mode component. Such a virtual display driver would present itself as a physical display driver to the application but duplicate any received commands: one copy is sent to the receiver through the network 416, while a second copy is passed to a physical graphics processing unit or a virtual graphics processing unit to create a picture which can be captured by frame capturing unit 402.

Graphics command filter 404 communicates with the sender-side universal cache 406 and with the region detector 405 to determine which graphics commands are eligible for further processing before transmission over the network 416 to the receivers.

In one example, a graphics API command(s) and associated arguments (bitmaps, textures, brushes, etc.) are ineligible for transmission if already present on all or some of the receivers. Such commands are filtered by the graphics command filter 404 and substituted by hash numbers identifying a cache location within cache 406. The universal cache 406 is synchronized across the system, between the sender and the receiver(s) via cache synchronization procedure 412.

A graphics API command can also be ineligible for transmission if Region Detector 405 decides to utilize a video or a picture encoder (discussed below) for the area which the graphics API command affects. The region detector 405 executes a process discussed below.

The graphics command filter 404 also transmits statistics such as quantity of graphics commands, types of commands, un-cached sizes, and region borders to Region Detector 405. The Region Detector 405 compares the statistics against its own motion detection data and region classification in determining whether to use the graphics API command interceptor 401 or a video/picture encoder.

In one example, the Region Detector 405 is biased towards using graphics commands. However, it will be appreciated that a video codec can be more efficient if an application utilizes many GDI commands to enable a highly-dynamic picture.

After a command has been found to be eligible for further processing it is converted to a universal format by Graphics Command Translator 408. The universal format can be common across various graphics APIs. The common format may be based on an existing format such as PostScript with additions and amendments. The format can be optimized for simplicity and ease of interpretation and rendering by the receiving devices. The format can be optimized for interpretation and rendering by simple low-power hardware implementations, or software implementations.

The translated commands are compressed with graphics command compressor 409. The compressor can be a run-length encoding algorithm where repeating items are replaced by the item and a number of times the item occurs in the sequence. More advanced compressor algorithms can convert a command into a set of equivalent commands, then compressed by ZIP or RLE algorithm. This reduces the bandwidth and latency requirements for transmission to the receivers.

The resulting bit stream is sent to the multicasting unit 413, discussed below, and transmitted over the network 416 via the hybrid multi-channel network transmission protocol stack 414.

The stack 414 utilizes the UDP protocol for transmission and IP protocol for routing. The stack 414 is discussed below. It will be appreciated that other types of network protocols could be used as well. For example, TCP/IP could be used, but would be subject to high latency for a sub-optimal user experience.

Frame capturing unit 402 captures frame data of the application from the video memory of the server, for example, at a frequency of 30-50 frames per second. It will be appreciated that a higher capture rate can be used as necessary. A kernel mode software component for the host operating system may be used to improve data acquisition speed from graphics. Alternatively, frame capturing unit 402 can be implemented in user mode.

The frame capturing unit 402 can capture portions of the screen where the application is displayed or the whole screen. In one embodiment, the capturing unit 402 captures the whole screen and manipulates the captured image to process only the areas of interest, as discussed below. In another embodiment, the capturing unit 402 only captures one or more specific regions where the application is displayed.

The frame capturing unit 402 provides the region detector 405 with a new image frame every 20-30 ms or as frequently as every 5-10 ms. It will be appreciated the frame capture rate is determined, in part, based on the frame rate of the output. The rate (in ms) is equal to 1000 divided by the frames per second of the output. The region detector 405 therefore receives these images from frame interceptor 402, a stream of intercepted graphic API commands from interceptors 401, and a stream of intercepted video API commands from interceptor 403.

Region detector 405 then determines, for each region in the image, whether to use a command-based approach, a video codec or a picture codec. The regions may be non-rectangular, as discussed below.

Region detector 405 then feeds the image frame to the video encoder 407 along with the mask of the regions to be encoded with video, as discussed below. The region detector 405 can work with a variety of picture encoders 410 for different situations.

For example, there may be two types of picture encoders 410: a progressive image encoder for large image elements and a simple, lossless or lossy image compressor for small images. The progressive image encoder can be more processor-intensive to use, but can greatly compress the size of the image. In contrast, small images already require little bandwidth, and therefore benefit more from a fast encoder. The progressive image encoder would compress efficiently on large image sizes while small images can be processed with a fast encoder.

The region detector 405 provides the picture encoders 410 with image elements, as discussed above, for encoding. The video encoder 407 and picture encoders 410 encode the data, thereby compressing the data, and passes the compressed data to the multicasting unit 413.

The multicasting unit 413 maintains communication sessions for one or more receivers, defines optimal routing, manages time-stamping necessary for synchronization, adapts bit rate by changing parameters of video encoder 407 and picture encoders 410 depending on network feedback data which it receives from the network stack 414.

The multicasting unit 413 uses the network stack 414 to create communication channels of different types depending on payload and latency requirements. The multicasting unit 413 manages relative priorities of multiple channels and establishes connections with receivers. The multicasting unit 413 also transmits data to the receivers.

As discussed below, the network stack 414 can have three types of channels: guaranteed delivery, non-guaranteed delivery and non-guaranteed delivery with forward error correction.

In one embodiment, the multicasting unit 413 establishes guaranteed delivery channels for API commands, non-guaranteed delivery channel for video codec encoded data if network conditions are robust, and non-guaranteed delivery with FEC for video when network conditions are unreliable and also for the audio streams and picture codec encoded data. The multicasting unit 413 can transmit application data over a guaranteed delivery channel with low priority. Audio data can be transmitted with high priority because degradation in audio quality due to packet loss or jitter can lead to a much worse perceived degradation of quality as compared to video.

Video play commands (such as DirectShow, Core Video, QuickTime) and media data streams associated with these commands can be intercepted by Video Interceptor for pass-through 403. The interceptor 403 is implemented as multiple command-specific software components for different types of media.

In one example, a DirectShow video interceptor for Windows may be implemented as a DirectShow filter with the highest priority to ensure it is first in the DirectShow's processing pipeline. Such a filter would filter out the commands and API calls of interest (such as a request to play a video file) and pass them down to multicasting unit 413 and network stack 414.

The interceptor 403 passes through the captured media data directly to the receiver without replaying it on the sender system and re-encoding it with Video Encoder 407. For example, the data can be transmitted over a non-guaranteed deliver channel with or without FEC depending on the network conditions such as packet loss and available bandwidth.

The video pass-through interceptor 403 communicates with Region Detector 405 regarding regions drawn by a set of media rendering commands (such as video rendering). The Region Detector 405 can use this information to decide whether it will apply the Video Encoder 407 to these regions. The decision can be affected by factors such as availability of codecs necessary to decode the raw media data on the receiver or if the video encoder is preferable for other reasons (such as limited CPU capability on the receiver).

The corresponding data (such as a video file or a video stream from the webcam) would be sent to A/V Wrapper 411. The wrapper 411 will add information about the media type, frame description data, etc. The wrapper 411 may also transcode the media to another format, if necessary. The wrapper 411 ensures compatibility of media data at the receivers and provides the receivers with sufficient metadata to play back the media data.

Figure 5:
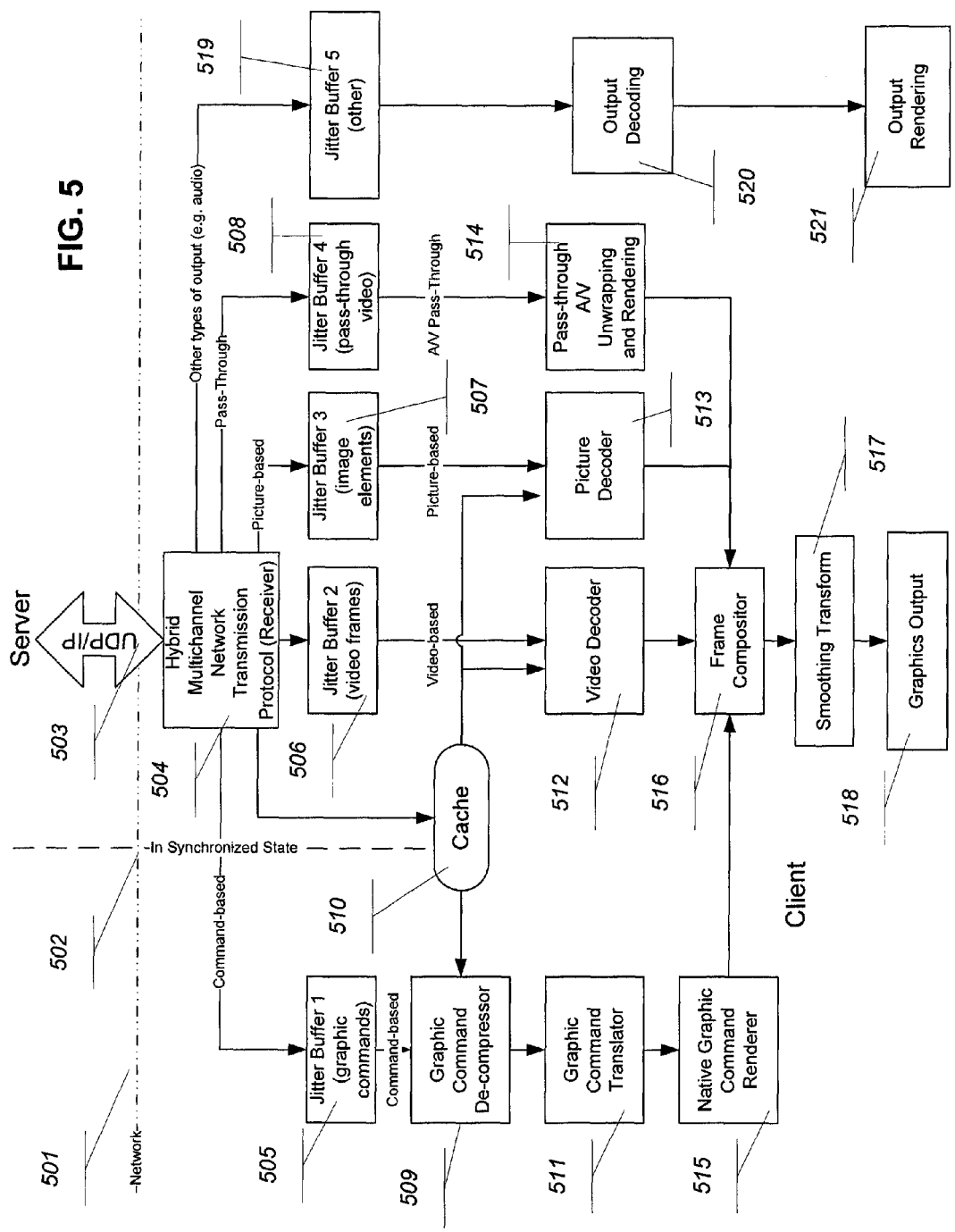
FIG. 5 illustrates an example decoding and rendering engine executing on a client for providing an improved transfer protocol for remote computing.

FIG. 5 illustrates an example decoding and rendering engine executing on a client for providing an improved transfer protocol for remote computing. The client can execute on a receiver device and be configured to receive encoded data. The client can further render the encoded data into graphical output for a user. The client is also able to decode and render other types of output including but not limited to audio, data files, data streams, printer data streams, etc.

In one embodiment, a receiver would consist of the network transmission protocol stack 504, a video jitter buffer 506, a video decoder 512 and a video renderer 518. The receiver would only utilize video decoding by the video decoder 512. With a sufficiently low frame rate, the jitter buffer 506 would be unnecessary. The received encoded data would be appropriately encoded by the sending, with no picture encoding, pass-through encoding, or GDI commands.

This receiver can be a simple and energy-efficient design implemented as a decoding chip in hardware.

In another embodiment, a simple operating system can load and execute the components 504, 506, 512, 518 discussed above as system services. This embodiment would include additional components required to support 504, 512, and 518.

In another embodiment, the components can be implemented as software components running within an operating system such as Mac OS X or Windows 7.

In another embodiment, additional types of output are supported by the receiver, such as audio, as discussed above. The receiver can be extended include additional jitter buffers 519, output decoders 520 and output renderers 521.

In another embodiment, a hybrid approach is used to encode the graphical output of an application, as discussed above. The graphical output is encoded into four types of data, including graphical commands, video frames, image elements, and pass-through video. The four types of data are handled by four pipelines as illustrated and merged into a single picture in real time for display.

The graphics command pipeline includes a jitter buffer for graphics commands 505, a graphics commands de-compressor 509, a graphics commands translator 511, a graphics commands renderer 515, and a distributed synchronized cache 510.

The video decoding pipeline includes a jitter buffer for video decoder 506 and a video decoder 512.

The image-based decoding pipeline includes a jitter buffer for image elements 507, a picture decoder (can be multiple types) 513, and a distributed synchronized cache 510.

The pass-through video pipeline includes a jitter buffer for image elements 508 and a pass-through video unwrapping and rendering 507.

The pipeline outputs are combined by Frame Compositor 516 into a single image. The image is processed by a smoothing transformation module 517, which smoothes region borders in the image. The image is then displayed as graphical output at 518.

The smoothing transformation can remove artifacts caused by different methods used for encoding different regions. An example smoothing transform is a de-blocking transform. It will be appreciated that different transformations can be used, depending on the situation.

In one embodiment, jitter buffers 505, 506, 507, 508, 519 can have different implementations and algorithms. The jitter buffers handle different types of data, and therefore have different needs. For example, a jitter buffer can improve performance even with a low frame rate if there is high network latency. Thus, multiple jitter buffers are required to manage synchronization of various output types for a smooth user experience (such as audio/video synchronization). Jitter buffers dynamically change their size, verify timestamps on received data and discard, delay or re-arrange received data as necessary. This manages latency and maintains high quality output, especially over unreliable networks.

For example, a jitter buffer for graphic commands ensures the graphical GDI commands are processed by the receiver in correct order.

Cache 510 is used to retrieve picture elements and arguments for received graphics commands such as bitmaps or textures. As discussed above, the cache 510 can store such entities based on a hash number received from the sender. The cache 510 receives its data from the server cache over a separate data communication channel and maintains itself in a synchronized state with the sender's cache.

Figure 6:
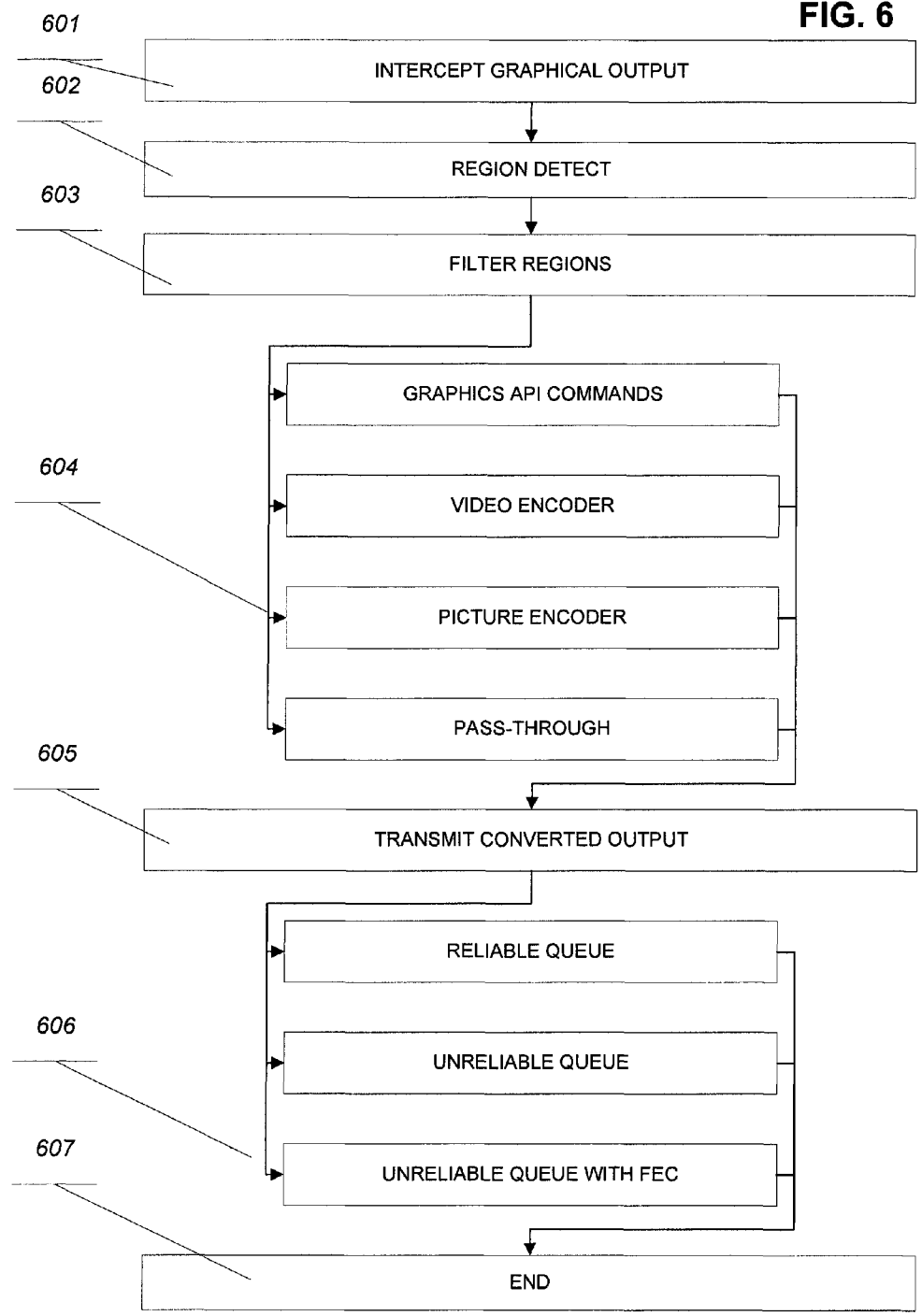
FIG. 6 illustrates an example procedure executed by a server to capture, encode, and send in accordance with the improved transfer protocol.

FIG. 6 illustrates an example procedure executed by a server to capture, encode, and send in accordance with the improved transfer protocol. The procedure can execute on a server, as discussed above, in communication with one or more clients.

In 601, the server intercepts graphical output from an executing application. For example, the application can be an existing application configured to provide an interactive user interface for a single user. By intercepting graphical output and user input (discussed below), the application can be provided to multiple users.

Alternatively, the graphical output can be intercepted and broadcasted to a plurality of clients. This can be used, for example, to broadcast a multimedia presentation to a plurality of clients distributed across a large geographical area.

In 602, the server executes a region detection procedure. The region detection procedure is configured to divide the graphical output into one or more regions, wherein each region has a dominant characteristic affecting optimal data conversion, as discussed below.

For example, the region detection can be provided by a module as discussed. In one example embodiment, the module can be a software module executing on the server. In another example embodiment, the module can be a combination of specialized hardware, general-purpose hardware, and executing software accessible to the server.

In 603, the server filters the regions detected above. For example, graphics API commands are not sent in video, picture, or pass-through regions. For example, video and picture data are not sent in pass-through regions.

In 604, the server converts the graphical output of each region into appropriate converted output. Four example regions along with their associated characteristics as discussed below.

Graphics API Commands are operating system or other commands used to render a graphical output. For example, Microsoft Windows offers a range of graphical commands to draw windows, circles, and other shapes. Such regions can be detected via standard Microsoft APIs. Other operating systems have similar principles of operation and also have standard APIs which can be utilized for region detection in a similar manner. Such regions can be optimally encoded in the original graphical commands, greatly reducing bandwidth requirements as compared to transmitting a screen shot.

It will be appreciated that such commands must be transmitted in a guaranteed manner: it is difficult to reconstruct a graphical output if one or more graphics API commands are lost to the client.

Video data can be encoded with a video codec. Video data can be compressed with minimal impact on the user experience it is continuously moving. Various optimizing codecs can be used, for example, switching to a high-quality codec when there is little movement within the video and switching to a low-quality codec when there is much movement within the video. It will be appreciated that high-movement video can be compressed at a higher rate because the human eye will perceive the movement in the video more than the details of the video.

It will be appreciated that such video data can be transmitted in a non-guaranteed manner, because individual lost packets will have minimal impact on the overall video rendering. If network conditions are very unreliable (as detected by network stack discussed below) it will be appreciated that such video data can be transmitted in a non-guaranteed manner with forward error correction applied.

Picture can be encoded with a picture codec. For example, the picture codec can be of a higher quality than the video codec used above and optimized for still graphics. Pictures require a high quality because the absence of movement will draw the human eye to graphical details, which need to be rendered for improved user experience.

It will be appreciated that such picture data can be transmitted in a non-guaranteed manner, but with forward error checking. Errors in encoded picture data can result in artifacts in the displayed graphical output, which can be minimized by utilizing forward error checking, discussed below. While it is possible to utilize guaranteed deliver, encoded picture data can require large amounts of bandwidth to transmit in a guaranteed manner, which may be inefficient.

Picture data and video data can be distinguished in the graphical output via a motion detector module, discussed below.

Pass-Through data can be, for example, encoded video data that can be decompressed by the client. If the client has sufficient resources (hardware, codec, etc) to decode the encoded video data as is, and the encoded video data satisfies bandwidth and quality requirements, the server can simply transmit the encoded video data directly to the client for rendering.

It will be appreciated that depending on the size of the encoded video data and its resistance to lost packets, either guaranteed, un-guaranteed, or un-guaranteed with forward error correction delivery may be used, discussed below.

In 605, the server transmits the converted output. As discussed above, the converted output can be transmitted over a network configured to carry digital information. The converted output can be transmitted to one or more clients for rendering.

In 606, the server transmits the converted output via an appropriate queue. A variety of queues are available, each queue configured with different transmission and reliability characteristics. Example queues include:

A reliable queue, which guarantees delivery and sequence of underlying packets. The reliable queue relies on acknowledges sent back by the receiver over control channel. Each packet with a chunk from reliable channel has sequence number. Periodically, the receiver sends back to the sender the sequence numbers of the packets it has received («ACKs vector» chunk). When sender does not receive ACK for a packet for some time, it considers the packet lost and resends packet's chunks that originated from reliable channels. It does not wait for ACK before sending next portion of packets.

An unreliable queue, which does not guarantee delivery and sequence of underlying packets. The unreliable queue prefixes each packet with in-channel sequence number to restore the order and discard duplicates on the receiver side. No other checking is done, thus creating minimal possible delay and CPU utilization. Observable packet loss can equal or slightly exceed (due to interleaving) the network packet loss rate.

An unreliable queue with forward error correction (FEC), which sends redundant information distributed among the transmitted packets that help recover lost packets. In one embodiment, FEC implementation is based on a modified Luby transform codes (LT codes), which is faster and simpler than traditional Reed-Solomon. This allows recovery from single packet loss and burst packet losses. In one embodiment, the FEC uses an N×M matrix to select packet subsets to XOR (original LT codes use pseudo-random subsets). Bit rate overhead is equal (N+M)/(N*M). Testing with emulator has shown that for network packet loss rate 15%, adding FEC can reduce observable packet loss to 0.5%. For 5% network packet loss, the observable is ~0.01%

In another embodiment, FEC sacrifices robustness in rare, cases (very low bandwidth, very high packet loss) to minimize latency in common case (network bandwidth>>data bit rate, packet loss<20%). This can be achieved by interleaving the channel chunks in the UDP packet, which guarantees that no single channel can introduce additional delay to another channel. This almost eliminates delays related to packet loss.

In 607, the server exits the procedure.

Figure 7:
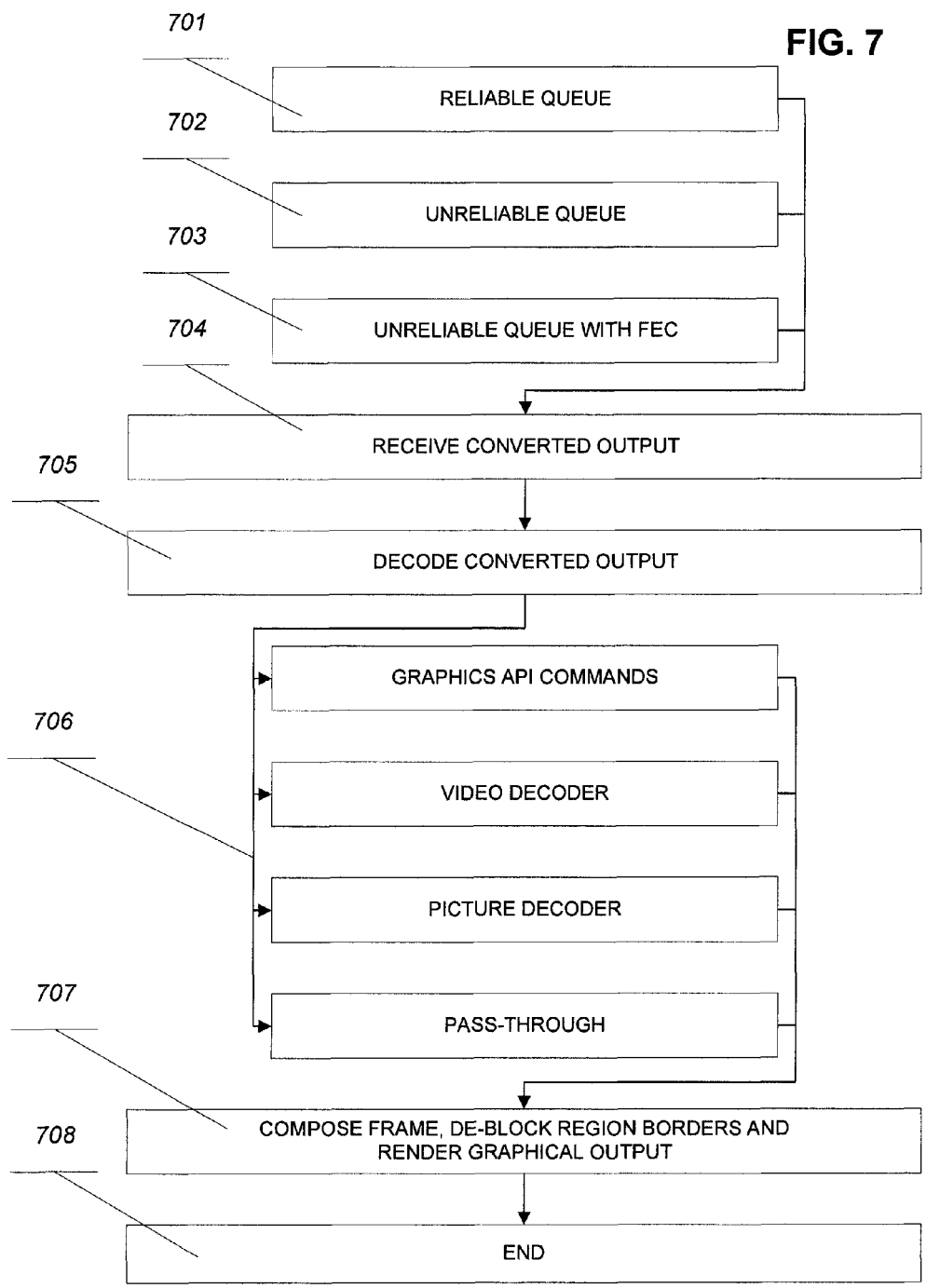
FIG. 7 illustrates an example procedure executed by a client to receive, decode, and render in accordance with the improved transfer protocol.

FIG. 7 illustrates an example procedure executed by a client to receive, decode, and render in accordance with the improved transfer protocol. The procedure can execute on a client, discussed above. The procedure can receive data from a server as discussed above in FIG. 6.

In 701, the client can receive data from a reliable queue. The reliable queue can be as discussed above in 606.

In 702, the client can receive data from an unreliable queue. The unreliable queue can be as discussed above in 606.

In 703, the client can receive data from an unreliable queue with FEC. The unreliable queue with FEC can be as discussed above in 606.

It will be appreciated that each queue can be associated with one or more jitter buffers, which are dynamically adjusted as discussed.

In 704, the client can receive the converted output from one or more of the above queues, in any combination. Each of the queues can produce an output in accordance with received data and queue protocol. Jitter buffer algorithms are applied to various channels carrying various types of data in 704. The jitter buffer is useful to minimize distortions in the perception of the received data after rendering. In the case of audio data it would be used to minimize glitches and cracks. In the case of video it could be used to minimize "meltings" and "dust" or similar distortions.

The reliable queue will request retransmissions of any missing packet and is guaranteed to output the packet stream transmitted by the server. The unreliable queue will output the packet stream as received by the client. The unreliable queue with FEC will attempt to reconstruct any missing packets with the forward error correction algorithm, as discussed.

For the unreliable queue and the unreliable queue with FEC, missing packets can be synthesized from nearby packets. For example, missing packets can be given assigned a value extrapolated from adjacent packets.

The client can also dynamically adjust the capacities of the jitter buffers responsive to network traffic conditions.

In 705, the client can decode the converted output as received from the above queues. The client determines an appropriate method of decoding each portion of the converted output, as discussed below.

In 706, each type of converted output can be decoded as appropriate. Appropriate decoding is determined, in part, on the type of encoding used.

For example, graphics API commands are replicated on the client by transmitting the commands to the appropriate API. Large amounts of screen data can be rendered in this manner with minimum bandwidth requirements.

For example, video data can be decoded by an appropriate codec. The appropriate codec can be selected above by the server.

For example, picture data can be decoded by an appropriate codec. The appropriate codec can be selected above by the server.

For example, pass-through data can be simply passed through the client with no further processing. The pass-through data is compiled from the queues discussed above and rendered by the client with available resources (hardware, codecs).

In 707, the graphical output can be rendered. As discussed, rendering the graphical output can include rendering the graphics API commands, rendering the video data, rendering the picture data, rendering the pass-through data. Rendering can further include composing the frame and de-blocking region borders.

In 708, the client can exit the procedure.

Figure 8:
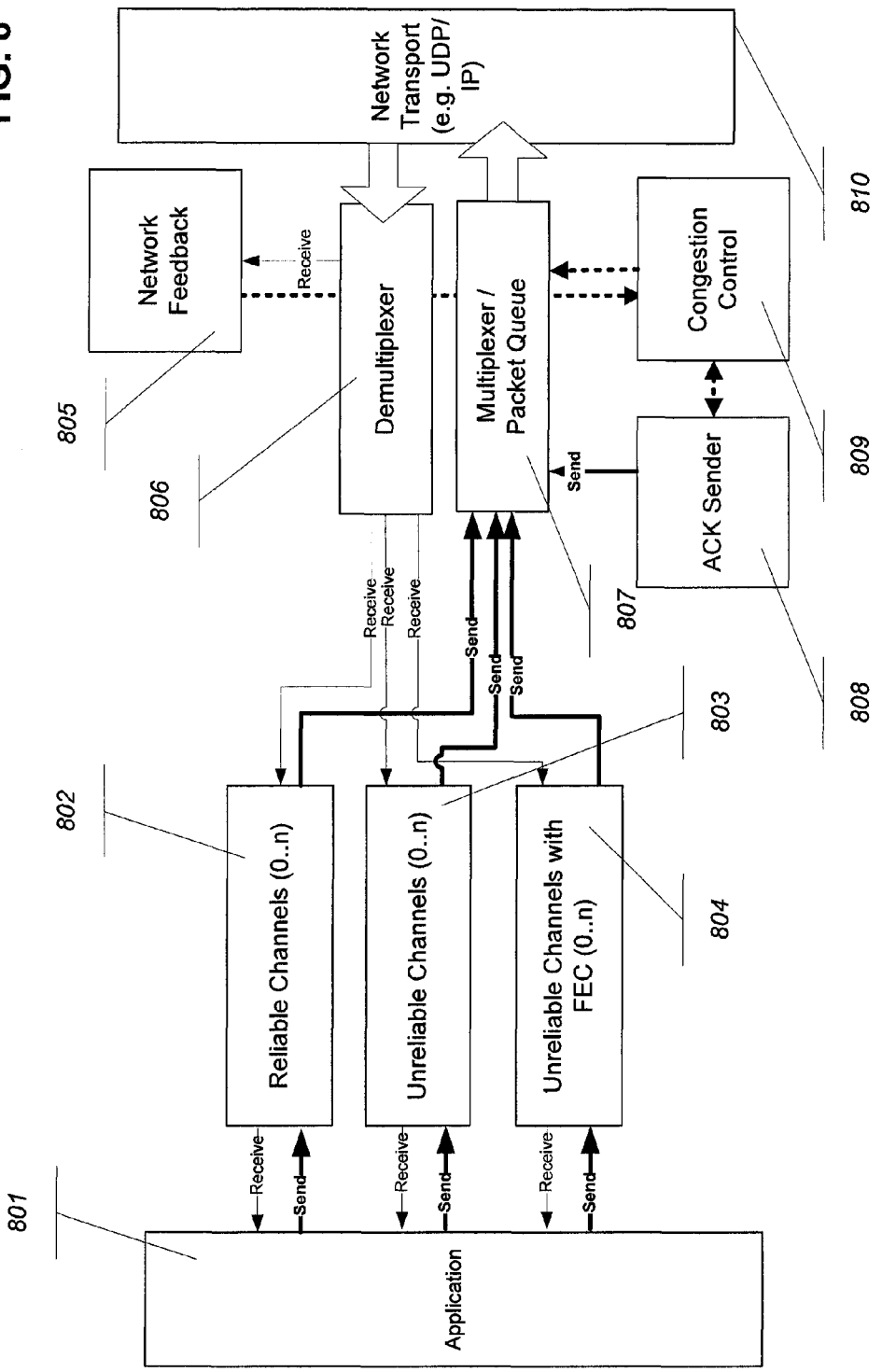
FIG. 8 illustrates an example network stack for providing an improved transfer protocol for remote computing.

FIG. 8 illustrates an example network stack for providing an improved transfer protocol for remote computing. The network stack can be provided by a server as discussed above.

Application 801 can execute on a server. As discussed above, the application 801 can be any software executing on the server providing a graphical output. For example, the software can be an application providing a user interface for user-desired functionality.

Reliable channels 802 can provide guaranteed transmission of packets. The reliable channels 802 can correspond to a reliable queue as discussed above.

Unreliable channels 803 can provide un-guaranteed transmission of packets. The unreliable channels 803 can correspond to an unreliable queue as discussed above.

Unreliable channels with FEC 804 can provide un-guaranteed transmission of packets with forward error correction. The unreliable channels with FEC 804 can correspond to an unreliable with FEC queue as discussed above. The FEC provides redundancies among the packets to allow reconstruction of missing packets if necessarily. This increases the reliability of the channels with minimal additional overhead.

Each queue discussed above can be associated with one or more channels. Each channel can be associated with a priority level. The network stack can handle each channel in accordance with its priority level. In addition, channels can be divided among multiple executing applications if necessary.

Network feedback module 805 monitors network congestion and modifies transmission parameters as necessary. For example, if an increase in collisions is detected on the network, transmission rates may be reduced. If increased packet loss is detected, the system can switch transmission of certain types of data from non-guaranteed channels to non-guaranteed channels with FEC. Also depending on network conditions, FEC parameters can be adjusted affecting bandwidth and packet loss levels. Similarly, if low numbers of collisions is detected, the network feedback module 805 may indicate an increase in transmission rate is warranted.

De-multiplexer 806 de-multiplexes packets received from the network transport. Packets are multiplexed into the appropriate channels. For example, each packet may include a channel identifier identifying the channel it belongs to.

Multiplexer and packet queue 807 multiplexes packets from the channels into a packet queue for transmission over the network transport. As discussed above, each packet may include a channel identifier. Multiplexer takes into account priorities of different channels.

ACK sender module 808 can receive necessary acknowledgments from the client for the reliable channels. The receiver periodically transmits the packet identifiers of received packets. For example, the packet identifiers can be transmitted as a ACKs vector chunk. Once the ACK sender module 808 receives the ACKs vector chunk, the identified packets are known to have been received by the receiver.

Congestion control 809 can execute a congestion control module. Effective congestion control in a network transmission protocol prevents congestion collapse. When congestion collapse occurs, little useful throughput occurs due to congestion, high packet loss, and high packet. Prior congestion control algorithms are implemented in TCP and other network protocols, but are not efficient and aggressive enough to deliver low-latency high quality data stream delivery using high bandwidth links. In one embodiment, a network transport protocol can utilize a different congestion control mechanism which effectively probes available bandwidth and takes advantage of available network capacity.

Terms and Definitions

Network Congestion—network congestion occurs when a link or node is carrying so much data that its quality of service deteriorates. Typical effects include queuing delay, packet loss or the blocking of new connections.

Congestion Signal—the notification that congestion has occurred on the network path. It is triggered by two successive lost or timeout packets.

Round Trip Time (RTT)—the time required for a packet to travel from a specific source to a specific destination and back again.

Inter Packet Gap (IPG)—a time delay between successive packets sent by the sender.

Round—one step of the algorithm. Round time is equal to average RTT so that the actions made at i-th round is a response to network reaction to actions made at (i−1)-th round.

Congestion Control Algorithm Description

The algorithm is rate-based and controls data rate through IPG value. In contrast, TCP utilizes a congestion window value. The algorithm takes RTT samples and congestion signals as inputs.

A RTT sample is calculated for each sent packet. The RTT sample is the time delay between when a packet was sent and acknowledged. Thus, RTT samples arrive with each acknowledged packet. Given RTT samples, one can calculate four derived characteristics:

RTT—exponential average of received RTT samples with gain $\alpha$.

DetailedRTT—exponential average of received RTT samples with gain $\beta, \beta > \alpha$.

RTTVariance—variance of RTT samples from average RTT.

BaseRTT—approximation of the lower bound of RTT samples so far.

RTT is the average over long period of time, DetailedRTT is the average over shorter period and BaseRTT is approximation of the minimum achievable round trip time over uncongested network.

From this values, one derives three dimensionless variables:

$$Feedback = \frac{DetailedRTT}{RTT},$$

$$Q_d = 1 - \frac{BaseRTT}{DetailedRTT},$$

$$Q_a = 1 - \frac{BaseRTT}{RTT}.$$

Feedback characterizes a current router's queue state related to its average state. Feedback is usually in range (0.5, 1.5) but theoretically it can be any positive number.

$Q_d$—detailed queuing factor that lay in range [0, 1]. It characterizes current queuing delay on routers in the small time scale. 0 indicates small queues, 1 indicates large ones.

$Q_a$—average queuing factor that lay in range [0, 1]. It characterizes current queuing delay on routers in the larger time scale.

Control is performed through changing the value of IPG. Sender ensures that the time delay between successive packets is larger than IPG obtained from congestion control algorithm. IPG changes after each sent packet and can be calculated in following way:

$$IPG = \begin{cases} BaseIPG_i \cdot Feedback, & \text{if } Q_d \leq Q_{thresh.} \\ BaseIPG_i \cdot Feedback \cdot [1 + R \cdot (Q_d - Q_{thresh.})], & \text{if } Q_d > Q_{thresh}, \end{cases}$$

where

BaseIPG$_i$—desired value of the IPG for current round. It is updated each round or in the response to the congestion signal.

Q$_{thresh.}$—threshold for queuing factor. When queuing factor exceeds these threshold additional measures is applied to increase IPG to reduce queue sizes on routers.

BaseIPG$_i$ is updated according to the following algorithm:
If congestion occurred:
BaseIPG$_{i+1}$=BaseIPG$_i$·A, where A>1 (usually near 2).
If no congestion occurred in i-th round:

$$BaseIPG_{i+1} = \frac{BaseIPG_i \cdot C}{BaseIPG_i + C}, \text{ where}$$

$$C = \frac{RTT}{S} \text{ and}$$

$$S = \begin{cases} S_+ > 0, \text{ if } Q_a \leq Q_{allowed} \\ S_- < 0, \text{ if } Q_a > Q_{allowed.} \end{cases} - \text{is so called step.}$$

The above formulas can be explained in terms of packet rate. Packet rate is a number of packets sent per second. Without the consideration of detailed IPG control, packet rate can be expressed as:

$$R_i = \frac{RTT}{BaseIPG_i}.$$

And from above formulas one can derive $$R_{i+1} = R_i + \frac{RTT}{C} = R_i + S.$$

So BaseIPG is updated accordingly to altered AIMD (Additive Increase Multiplicative Decrease) scheme with additive decrease in case of high (>Q$_{allowed}$) average queuing factor.

Connection Establishment Sequence
Server listens for connection; clients connect (as in TCP).
4-way handshake. More resistant to DoS attacks.
3-way shutdown. No bogus half-closed states, as in TCP.
Exact sequences for connection establishment and shutdown are discussed below.

Network transport 810 can be provided by an existing protocol, such as UDP/IP. It will be appreciated that other protocols can be used, but would eliminate many benefits of the network stack. For example, using TCP/IP would provide guaranteed delivery of all packets, regardless of channel used, but adds significant processor and bandwidth overhead.

Figure 9:
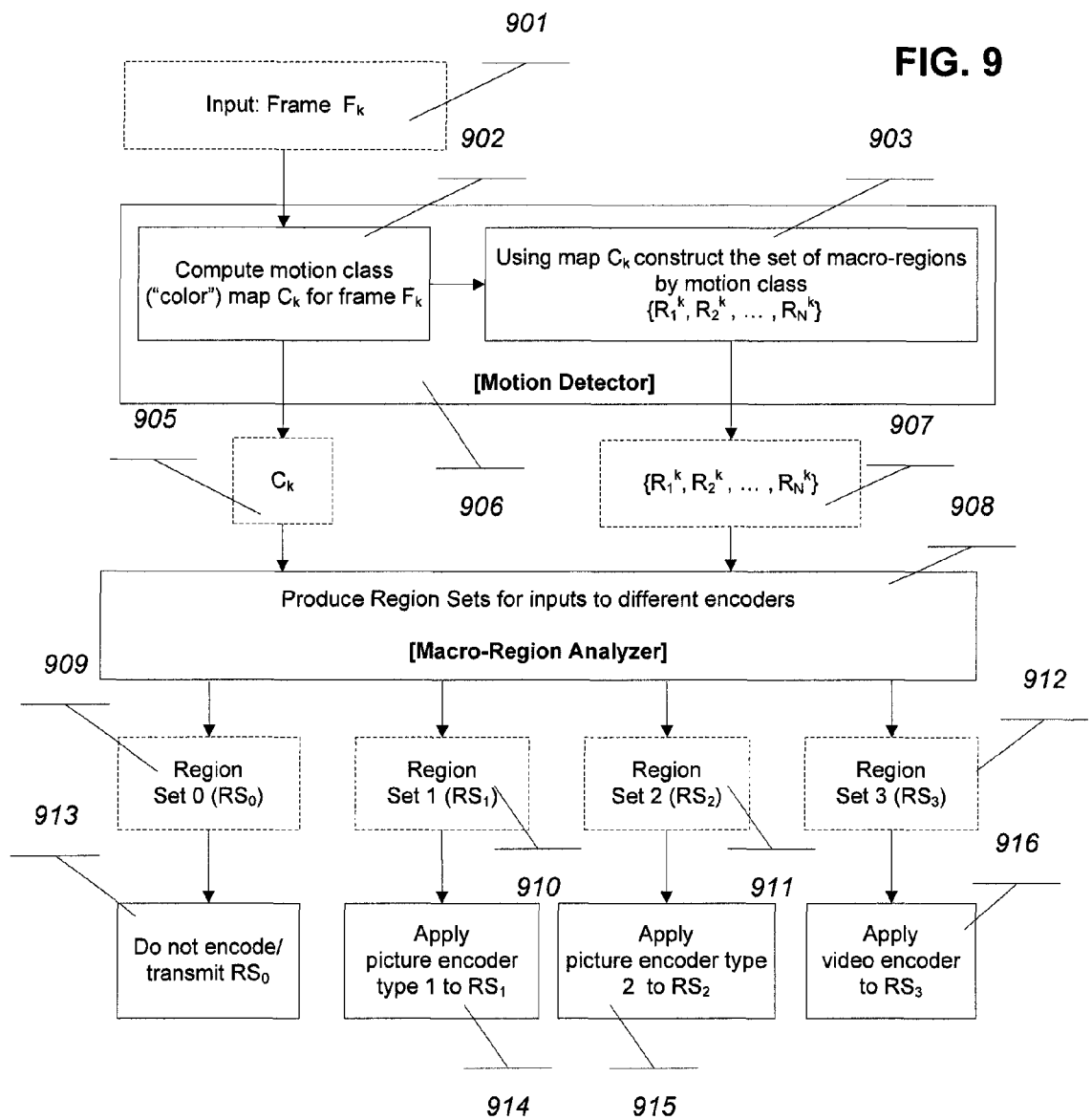
FIG. 9 illustrates an example procedure executed by a server to provide a region detector module.

FIG. 9 illustrates an example procedure executed by a server to provide a region detector module. The region detector determines an appropriate encoding scheme for each region in a graphical output by detecting motion and monitoring streams of graphics and video commands.

The graphical output is first divided into regions. In one embodiment, graphic command encoding is applied if a region is relatively static and contains text or simple graphics generated by 2D graphic API commands such as text drawing. Video encoding is applied for regions with intensive motion. Pass-through video encoding can be used for regions with video generated by playing a video stream using media API commands, if decoding codecs CPU resources are available on the receiver.

Progressive wavelet-based codec is applied to regions with large dynamic parts which change slowly by frequently. An example of such regions may be a photo slideshow changing images every 3-5 seconds. Simple lossless picture compression is used for small areas that do not change very rapidly. The system also uses a distributed cache system, discussed above.

Region detector relies on frame capturing method which gives it bitmaps (or frames) F$_k$ (901) with relatively high frequency (25 frames per second and above). The region detector then applies a simple motion detection routine 902 described below to compute "motion class map" C$_k$ (905) for frame F$_k$ (901).

The resulting C$_k$ (905) is a map of numbers with motion intensity assigned to each block of the grid, as discussed below. Step 903 then constructs a region set {R$_1^k$, R$_2^k$, ..., R$_N^k$} 907, which is a convex hull of micro-regions with levels of C$_k$ within predefined ranges, discussed below. In one embodiment the step of constructing the convex hull of micro-regions could be omitted for efficiency purposes (this would result in a simpler and a less intelligent algorithm).

Regions can be assigned a color based on a motion intensity of the region. Regions with intensive motion are red, while regions with no motion are white. Regions with sporadic motion beginning to appear are green, while regions where motion is slowing down are yellow. These united regions 907 are called macro-regions and together with motion class map C$_k$ (905) are passed as inputs to Macro-Region Analyzer 908. If united regions have not been constructed then macro-region analyzer algorithm is less intelligent but simplified and faster. This may be considered as a trade-off during implementation.

Macro-Region Analyzer 908 also monitors streams of graphics API commands (such as GDI) and video API commands (such as DirectShow), discussed above. The analyzer 908 outputs region sets to be used by video encoder 912, picture encoder type 1 (large pictures) 910, and picture encoder type 2 (small image elements) 911. The analyzer 908 also discards graphics and video commands that will not be transmitted over the network in 913.

For region set 909 ("do not transmit"), graphics/video API commands encoding can be used, or no information need be transmitted at all (picture is static).

In one embodiment, "red" regions will be encoded with video, or transmitted using video pass-through in 916. "Green" regions the motion is generated by GDI commands (GDI region overlaps with green region) can be transmitted with GDI command encoding. Alternatively, a picture codec "large" or "small" depending on the region size can be used to encode the region. "Yellow" regions can be encoded with a picture codec: progressive if the area is large and simple for tiny areas. It should be noted that these are examples of simple heuristics. However, useful it should be appreciated that other techniques manipulating the micro and macro-regions and their contexts can be developed.

In 914, a type 1 picture encoder can be a progressive (e.g. wavelet-based) image encoder. The encoder is applied only to relatively large images (width and height exceed thresholds W$_{max}$ and H$_{max}$).

In 915, a type 2 picture encoder is a simplistic and fast lossless image compressor. The encoder is applied only to small images, typically the size of a block (width and height do not exceed thresholds W$_{max}$ and H$_{max}$)

Heuristics of macro-region analyzer are further explained below.

FIG. 10 illustrates an example procedure executed by a server to provide a simple motion detector module.

In 1001, the server receives $F_k$, a computer-generated frame, where k is the number of the frame.

In 1002, the server splits $F_k$ in (p×q) rectangular or square blocks $b^k_{p,q}$, in accordance with a macro block structure of the video encoding core utilized below.

In 1003, for each block $b^k_{i,j}$ of frame $F_k$, the server compares the block with the same block $b^{k-1}_{i,j}$ of the previous frame $F_{k-1}$.

In 1004, the server tests whether block $b^k_{i,j}$ is equal to $bk^{-1}_{i,j}$. If yes, the server proceeds to 1005a. If no, the server proceeds to 1005b.

In 1005a, the server decreases the motion score $m^k_{i,j}$ for micro-region $b_{i,j}$ and sets $m^k_{i,j} = m^k_{i,j} - \Delta_1$ where $\Delta_1$ is a non-negative integer. In one example implementation, $\Delta_1 = 1$ In 1005b, the server increases the motion score $m^k_{i,j}$ for micro-region $b_{i,j}$ and sets $m^k_{i,j} = m^k_{i,j} + \Delta_2$, where $\Delta_2$ is a non-negative integer. In one example implementation, $\Delta_2 = 4$ In 1006, the server assigns each micro-region $b_{i,j}$ motion class ("color") $c^k_{i,j}$ based on value of the motion score $m^k_{i,j}$ as follows:

if $m^k_{i,j} = 0$, $c_{i,j} = 0$ (motion class "transparent"),
if $0 < m^k_{i,j} < T_1$, $c^k_{i,j} = 1$ (motion class "green"),
if $T_1 \leq m^k_{i,j} < T_2$, $c^k_{i,j} = 2$ (motion class "yellow"),
if $T_2 \leq m^k_{i,j} < T_3$, $c^k_{i,j} = 3$ (motion class "red");

where $T_1, T_2, T_3$ being threshold values for motion scores $m_{i,j}$. In one example implementation, $T_1 = 10, T_2 = 20, T_3 = 30$.

In 1007, the server outputs a rectangular array $C_k$ of (p×q) values of $c^k_{i,j}$.

It will be appreciated that the server performs the illustrated procedure routine with the frequency of the current frame rate (typically 20-40 times per second).

Figure 11A:
FIG. 11A illustrates a first motion detection example screen shot.

FIG. 11A illustrates a first motion detection example screen shot. The displayed website screen shot has two motion-intensive regions. Region 1101 was recognized as "red" because it is a fast-changing flash animation. Region 1102 was recognized as "red" because it is an Adobe Flash video. There is a square on the right side of region 1101 where the motion becomes less intensive. This micro-region will be encoded using simple lossless picture codec. The picture element will also be cached.

Figure 11B:
FIG. 11B illustrates a second motion detection example screen shot.

FIG. 11B illustrates a second motion detection example screen shot. The displayed website screen shot can be similar to that discussed above but contain a green (1105) and one yellow (1104) region. These regions differ slightly from the above screen shot and were not generated by OS graphics API commands. Instead, these regions were generated as an Adobe Flash animation, so the regions will be encoded with a simple lossless picture codec. Alternatively, the regions can be cached and not require transmitting.

Region 1105 contains a large image which is changing infrequently. For this macro-region picture-based wavelet codec will be used.

Regions 1103 and 1106 continue to be motion intensive and will be encoded using video encoder.

Figure 11C:
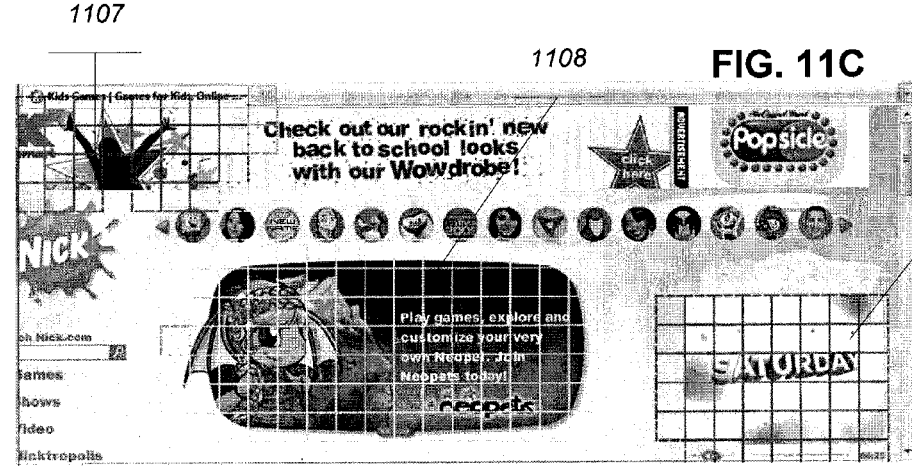
FIG. 11C illustrates a third motion detection example screen shot.

FIG. 11C illustrates a third motion detection example screen shot. The displayed website screen shot can be similar to that discussed above but region 1108 changed its color from green to yellow because its pictures started changing faster. The region detector may continue to use the picture-based wavelet codec for encoding, or the region detector may treat the whole region as a video region.

Regions 1107 and 1109 continue to be encoded as described above.

Figure 12:
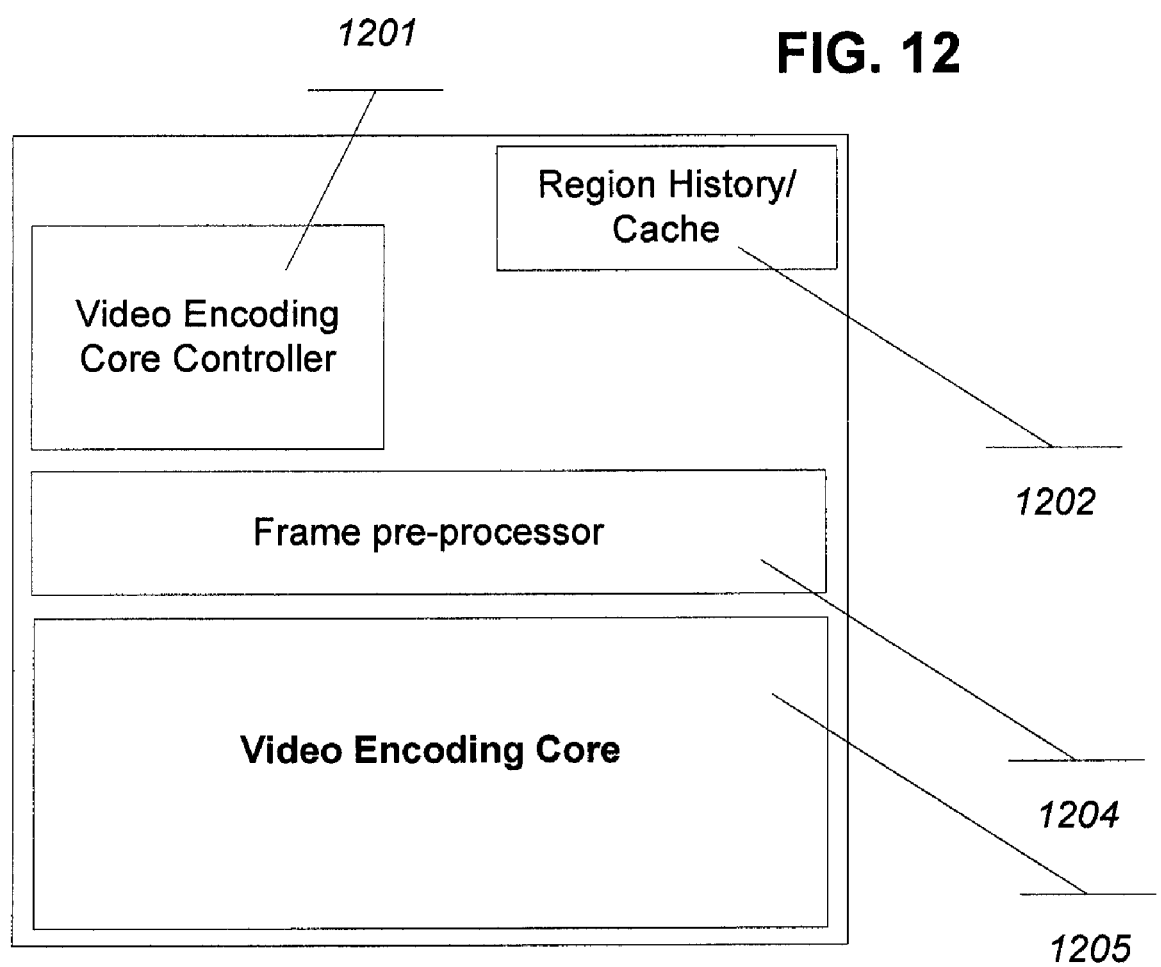
FIG. 12 illustrates an example video encoder for providing an improved transfer protocol for remote computing.

FIG. 12 illustrates an example video encoder for providing an improved transfer protocol for remote computing. The video encoder includes a video encoding core 1205 which could implement a standard video encoding algorithm such as H.264/MPEG-4 AVC or a proprietary low-latency video encoder. It will be appreciated that certain situations require a standards-compliant video encoding core while other situations require a proprietary solution for improved performance.

The video encoder described here has a frame pre-processor 1204 which overlays a black mask over an image. This allows the video encoder to only process the necessary regions. Frame pre-processing is discussed below.

Video encoding core controller 1201 communicates with various system components and initializes the encoding core with certain parameters or change these parameters (such as image size or bit rate).

Multiple instances of encoding cores may be running at the same time providing simultaneous encoding for several resolutions.

Figure 13:
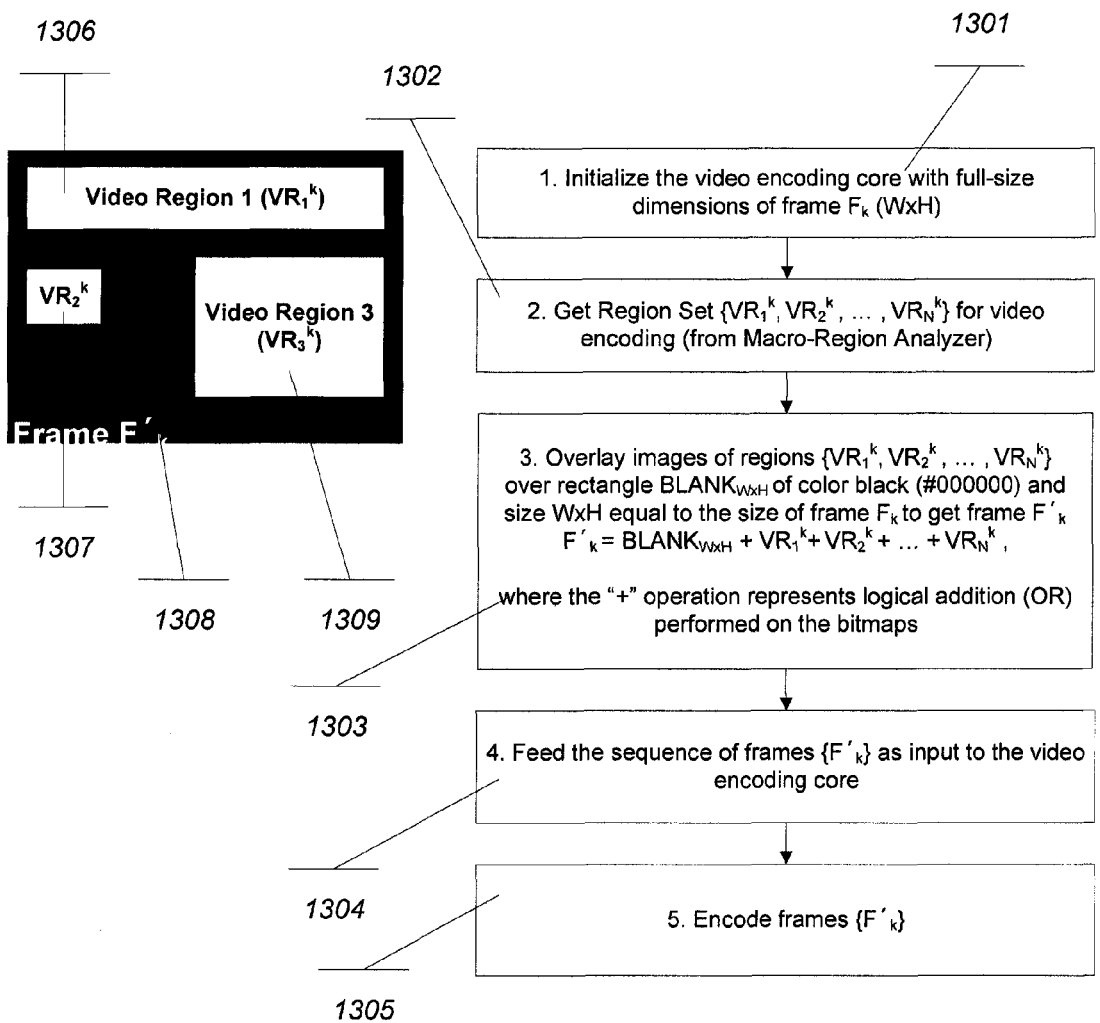
FIG. 13 illustrates an example procedure for pre-processing a graphical output.

Region history/cache 1202 maintains several tens of frames and region sets from previous analyses for Region Detector use and for fast predictive switching to video regions FIG. 13 illustrates an example procedure for pre-processing a graphical output. The procedure can execute on a server as discussed above. The purpose of the described procedure is to avoid frequent re-initialization of video encoding core with different region coordinates and sizes. Such a procedure would prove costly in terms of time and performance. A solution is to initialize it with large region and overlay black layer over the inactive regions thus saving processing resources of built-in motion-estimation procedures of the video encoding core, allow for efficient transmission of inactive area in the majority of cases resulting in non-transmission.

In 1301, the server initializes the video encoding core with full-size dimensions of frame $F_k$ 1308 (Width×Height)

In 1302, the server receives Region Set $\{VR_1^k, VR_2^k, \ldots, VR_N^k\}$ for video encoding from the Macro-Region Analyzer, discussed above In 1303, the server overlays images of regions $\{VR_1^k, VR_2^k, \ldots, VR_N^k\}$ over rectangle $BLANK_{W \times H}$ of color black (#000000) and size W×H equal to the size of frame $F_k$ to obtain frame $F'_k$. $F'_k = BLANK_{W \times H} + VR_1^k + VR_2^k + \ldots + VR_N^k$, where the "+" operation represents logical addition (OR) performed on the bitmaps. $VR_1^k$ (1306), $VR_2^k$ (1307), and $VR_3^k$ (1309) are illustrated.

In 1304, the server provides the sequence of frames $\{F'_k\}$ as input to the video encoding core, discussed above. For example, the video encoding core can utilize the H.264 standard.

In 1305, the server encodes frames $\{F'_k\}$, for example, using the H.264/MPEG-4 AVC standard for video compression or another standard.

Figure 14:
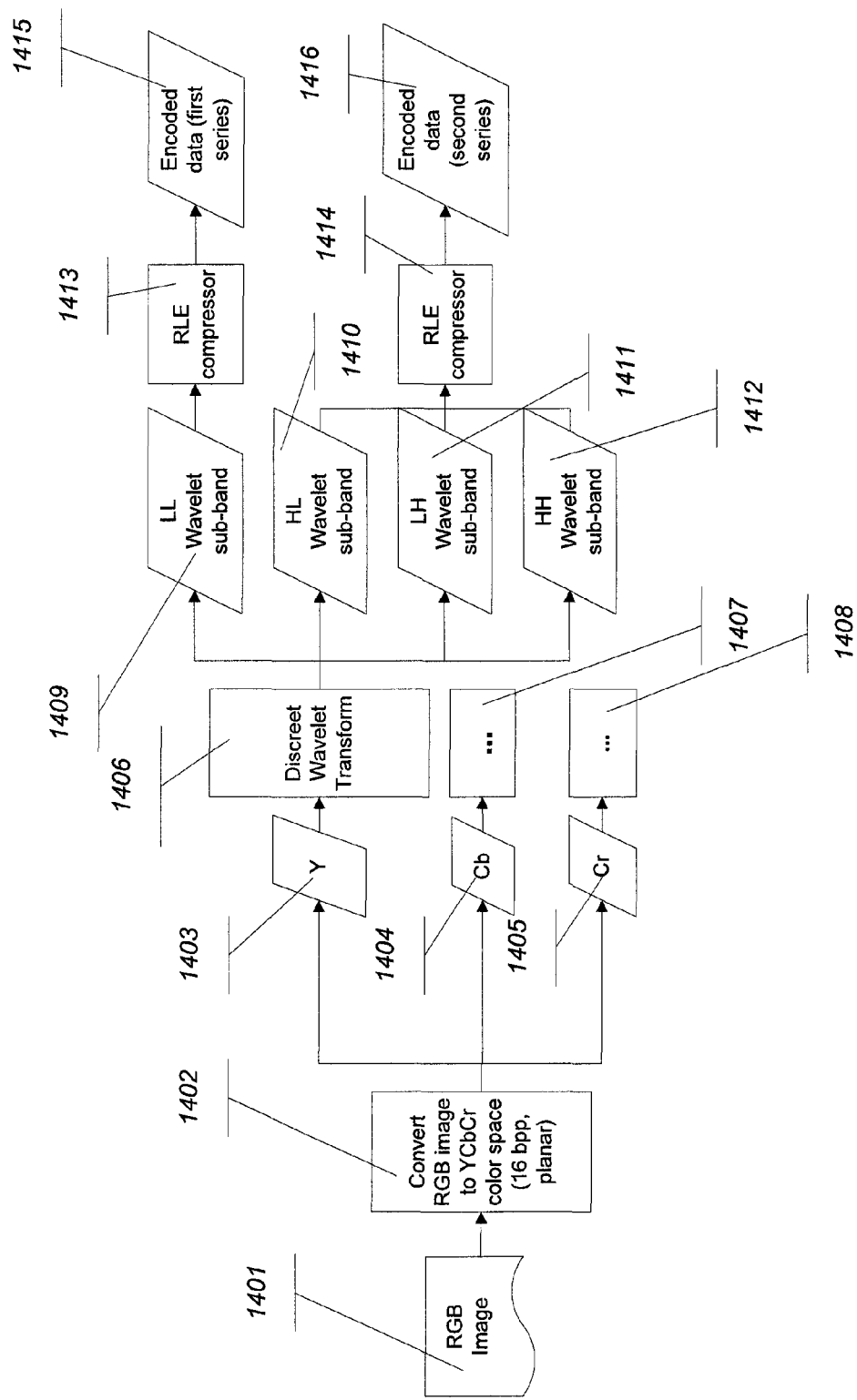
FIG. 14 illustrates an example procedure for providing a progressive picture encoder.

FIG. 14 illustrates an example procedure for providing a progressive picture encoder. The progressive picture encoder can execute on the server, as discussed above. The picture encoder is progressive because it prepares encoded image data in two series: first series 1415 and second series 1416. In 1415, the server sends LL-sub-band immediately to draw a rough image on the client.

The first series 1415 can be smaller in size and can be transmitted quickly to the receiver, providing a blurred version of the image. In contrast, the second series 1416 is a full-quality version of the compressed picture with more data. The second series 1416 can be transmitted to the receiver with greater latency.

It will be appreciated that the encoder can provide additional granularities. It will be appreciated that this encoder is well-suited to large images.

In a first step, the encoder converts an input RGB image (1401) to YCbCr color space (1402), producing a Y component (1403), a Cb component (1404), and a Cr component (1405). The Y component is a luma component ("brightness)". The Cb component is a blue-difference chroma component. The Cr component is a red-difference chroma component.

In a second step, the encoder applies a discreet wavelet transform such as Haar, to each of the above components (1406-1408). The processing pipelines for Cb and Cr components can be the same as for Y component (shown in the diagram)

In a third step, the encoder utilizes LL Wavelet sub-band for the first data series (compressing it with RLE prior to sending to the network (1409), the compresses the result with a RLE compressor (1413) before outputting the result (1415). Step 1413 can compress the result from the LL sub-band to above half from total output size.

It will be appreciated that Run-length encoding (RLE) is a form of data compression in which "runs" of data (a "run" is a sequence in which the same data value occurs in consecutive data elements) are stored as a single data value and a count, rather than as the original run. RLE is a very simple and fast compression algorithm. However, other data compression algorithms may be used.

The three remaining 3 wavelet sub-bands are similarly processed. The HL, LH, and HH sub bands (1410-1412) are fed into a RLE compressor (1414) before being outputted (1416).

It will be appreciated that the wavelet sub-bands represent four "sub-images": LL represents a smaller version of original image and HH represents noise levels. Sub-bands have high degree of correlation and can be well-compressed (i.e. with RLE algorithm).

Figure 15B:
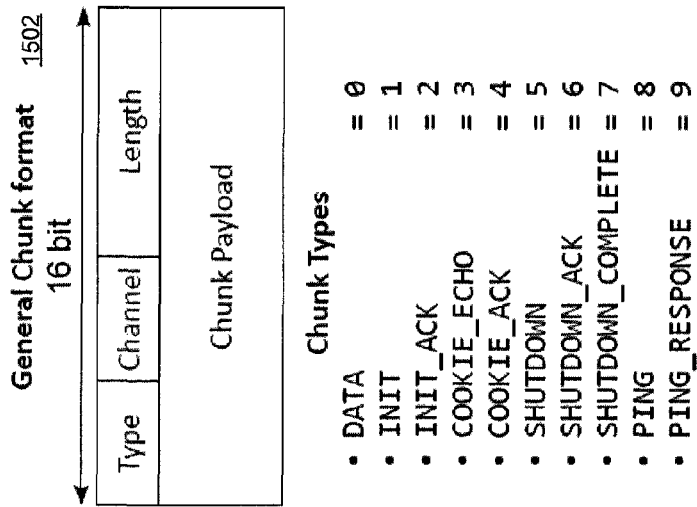
FIG. 15B illustrates an example chunk format.
Figure 15A:
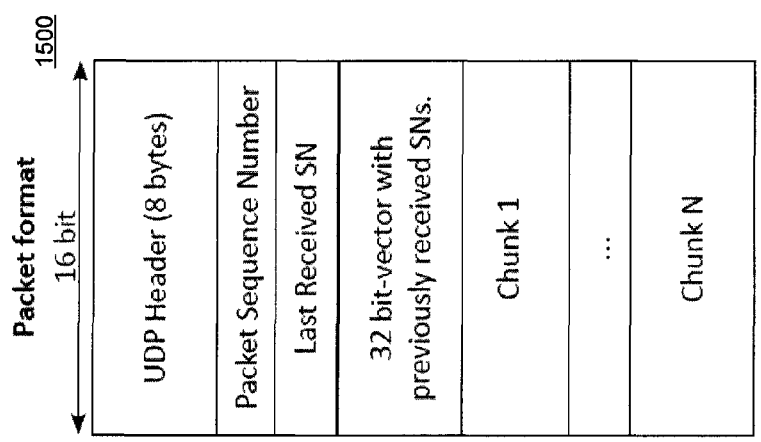
FIG. 15A illustrates an example packet structure.

FIG. 15A illustrates an example packet structure. Packet format 1500 illustrates one example packet format for use in the above system.

FIG. 15B illustrates an example chunk format. General chunk format 1502 illustrates one example chunk format for use in the above system.

Figure 15D:
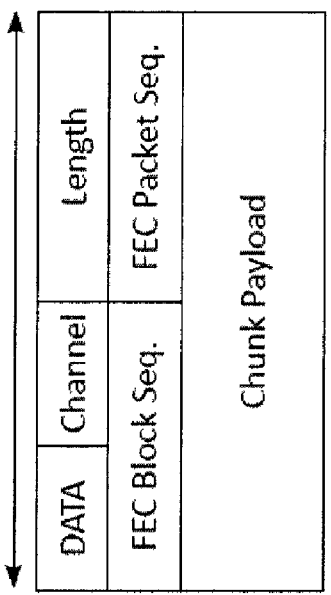
FIG. 15D illustrates an example chunk format for FEC channels.
Figure 15C:
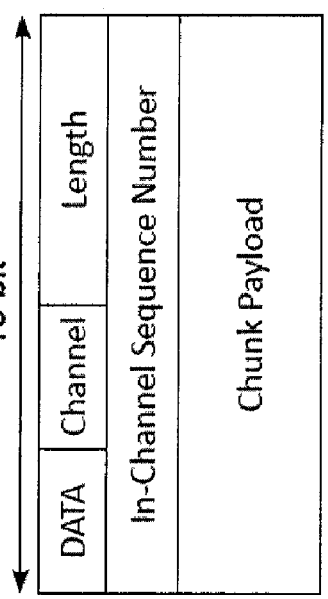
FIG. 15C illustrates an example chunk format for reliable and unreliable channels.

FIG. 15C illustrates an example chunk format for reliable and unreliable channels. Chunk format 1504 illustrates one example chunk format for use in the above system.

FIG. 15D illustrates an example chunk format for FEC channels. Chunk format 1506 illustrates one example chunk format for use in the above system.

Figure 15F:
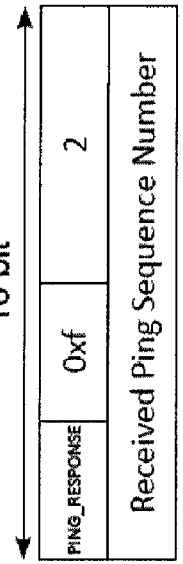
FIG. 15F illustrates an example ping response chunk.
Figure 15E:
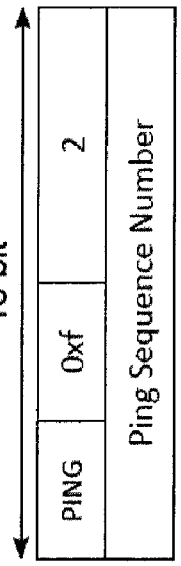
FIG. 15E illustrates an example ping chunk format.

FIG. 15E illustrates an example ping chunk format. Ping chunk format 1508 illustrates one example chunk format for use in the above system.

FIG. 15F illustrates an example ping response chunk. Ping response chunk format 1510 illustrates one example chunk format for use in the above system.

FIG. 15G illustrates a handshake sequence. In 1512, the client begins by sending an INIT with its initial sequence number.

FIG. 15H illustrates an example init chunk. Init chunk format 1514 illustrates one example chunk format for use in the above system.

FIG. 15I illustrates an example init_ack chunk. Init_ack chunk format 1516 illustrates one example chunk format for use in the above system. The server responds with INIT_ACK, containing server initial sequence number and a cookie (binary data).

FIG. 15J illustrates an example cookie_echo chunk. Cookie_echo chunk format 1518 illustrates one example chunk format for use in the above system. In response to the init_ack chunk above, client responds with COOKIE_ECHO, containing F (cookie).

FIG. 15K illustrates an example cookie_ack chunk. Cookie_ack chunk format 1518 illustrates one example chunk format for use in the above system. In response to the cookie_echo chunk above, server sends COOKIE_ACK thus notifying the client about successful connection. The server allocates any heavy-weight internal structures only after successful COOKIE_ECHO thus preventing attacks similar to SYN-flood in TCP.

FIG. 15L illustrates an example connection shutdown sequence. Flow 1522 illustrates that Peer 1 sends all pending data and then sends SHUTDOWN.

When Peer 2 receives SHUTDOWN, it sends all pending data, and then sends SHUTDOWN_ACK.

Upon receiving SHUTDOWN_ACK, Peer 1 sends COMPLETE, thus notifying Peer 2 that connection has been shut down.

FIG. 15M illustrates an example shutdown chunk. Shutdown chunk format 1524 illustrates one example chunk format for use in the above system.

FIG. 15N illustrates an example shutdown_ack chunk. Shutdown_ack chunk format 1526 illustrates one example chunk format for use in the above system.

FIG. 15O illustrates an example shutdown_complete chunk. Shutdown chunk format 1528 illustrates one example chunk format for use in the above system.

It will be appreciated that one embodiment of the receivers discussed above can be contact lenses displays. Contact lenses displays are discussed in "Augmented Reality in a Contact Lens", IEEE Spectrum Sep. 2009 http://www.spectrum.ieee.org/biomedical/bionics/augmented-reality-in-a-contact-lens/0 (last retrieved Sep. 28, 2009), herein incorporated by reference. Such contact lenses are able to display information to a wearer and communicate over a wireless device. These devices can function as receivers as discussed above and augment a user's reality by overlaying graphics in the wearer's field of vision. Being a compact device, these devices can be limited in functionality, for example, only rendering graphics commands and text. One embodiment of such devices can display relevant text as the wearer focuses on objects in his environment.

It will be appreciated that the graphical output discussed above can include 3D graphics. 3D graphics can be special graphics shot by multiple cameras, then merged together to create a hologram or other 3D image. Such 3D graphics is easily supported by the system above: the 3D graphics are compressed as appropriate by the server, and transmitted to a receiver for rendering. Assuming the receiver has appropriate computing resources and rendering capabilities, the 3D graphics can be rendered to the user. 3D graphics are discussed in "3D: It's Nearly There" The Economist—Technology Quarterly. Sep. 5, 2009, p. 22, herein incorporated by reference.

As discussed above, one embodiment of the present invention can be a system for providing computer-generated output, in particular graphical output, but also other types of output. The system includes a network configured to carry digital information. The system includes a server in communication with the network, the server configured to execute an application and an output capturing and encoding engine module (OCE engine). The application provides a graphical output. The OCE engine module is further configured to intercept the graphical and other types of output from the application. The OCE engine module is further configured to convert the graphical output into at least one of: graphical commands and video codec data. The OCE engine encodes other types of output utilizing appropriate methods for data compression and encoding (audio streams, data files, etc.)

The OCE engine module is further configured to transmit the converted output over the network. The system includes a client in communication with the server over the network, the client configured to execute a graphics and video decoding and rendering engine module (GVDR engine). The GVDR engine module is configured to, responsive to receiving the transmitted converted output, rendering the graphical output. The GVDR engine module is configured to intercept user inputs at the client. The GVDR engine module is configured to transmit the intercepted user inputs to the Input Processing module on the server. The OCE engine module can be further configured to convert the graphical output into at least one of: picture codec data and pass-through data. The OCE engine module can be further configured to execute a region detector module. The region detector module configured to divide the graphical output into a plurality of regions. The region detector module configured to convert graphical output associated with each region. The graphical output can include full-motion video, wherein the full-motion video is enclosed within one of the plurality of regions. The graphical commands can be represented by a universal intermediary graphical command language. The cloud engine module is further configured to receive the intercepted user inputs from the client. The Input Processing module on the server is further configured to provide the intercepted user inputs to the application for processing. The network can be unreliable and transmissions over the network can be non-guaranteed.

Another embodiment of the present invention can be a system for providing graphical output. The system includes a network configured to carry digital information. The system includes a server in communication with the network, the server configured to execute an application and an OCE engine module. The application can provide a graphical output. The OCE engine module is further configured to intercept the graphical and other types of computer-generated output from the application. The OCE engine module is further configured to convert the intercepted output into graphical commands and video codec data. The OCE engine module is further configured to transmit the converted output over the network. The system includes a plurality of clients in communication with the server over the network, the plurality clients each configured to execute a GVDR engine module. The GVDR engine module is configured to, responsive to receiving the transmitted converted output, rendering the graphical output. The GVDR engine module is configured to intercept user inputs. The GVDR engine module is configured to transmit the intercepted user inputs to the Input Processing module on the server for processing by the application.

Another embodiment of the present invention can be a method for transmitting graphical and other types of computer-generated output. The method includes intercepting graphical output or another type of computer-generated output from an executing application. The method includes converting the intercepted graphical output into at least one of: graphical commands and video codec data. The method includes transmitting the converted output over a network to a client executing a GVDR engine module. The transmitting includes parsing the converted output into a reliable queue, an unreliable queue, and an unreliable with forward error correction queue, wherein each queue has a plurality of channels. The transmitting includes transmitting the reliable queue, wherein each packet in the reliable queue is acknowledged by the client and includes a reliable packet sequence number. The transmitting includes transmitting the unreliable queue, wherein each packet in the unreliable queue includes an unreliable packet sequence number. The transmitting includes transmitting the unreliable with forward error correction queue, wherein each packet in the unreliable with forward error correction queue includes a transform code containing redundant information to recover lost packets. The intercepted graphical output can be further converted into at least one of: picture codec data and pass-through data. The method includes dividing the graphical output into a plurality of regions. The method includes converting graphical output associated with each region. The graphical output can include full-motion video, wherein the full-motion video is enclosed within one of the plurality of regions. The graphical commands can be represented by a universal intermediary graphical command language. The reliable queue can be used to transmit the graphical commands and the unreliable queue is used to transmit the video codec data. The transmitting the converted output further includes throttling transmission bandwidth based on a congestion control. The method includes receiving intercepted user inputs. The method includes providing the intercepted user inputs to the executing application for processing.

Another embodiment of the present invention can be a method for receiving graphical output. The method includes receiving a converted output over a network from a server, the server executing an application providing graphical output and a OCE engine module converting the graphical output into the converted output. The receiving further includes receiving a reliable queue, wherein each packet in the reliable queue includes a reliable packet sequence number, the receiving a reliable queue further including, responsive to receiving a reliable queue packet, transmitting an acknowledgement to the server. The receiving further includes receiving an unreliable queue, wherein each packet in the unreliable queue includes an unreliable packet sequence number. The receiving further includes receiving an unreliable with forward error correction queue, wherein each packet in the unreliable with forward error correction queue includes a transform code containing redundant information to recover lost packets. The receiving further includes compiling the reliable queue, unreliable queue, and unreliable with forward error correction queue into the received converted output. The method includes rendering a graphical output from the received converted output. The method includes, responsive to intercepting user inputs, transmitting the intercepted user inputs to the cloud engine module. The user inputs can be transmitted to the server via the reliable queue. The receiving further includes processing by a jitter buffer. The converted output includes at least one of: graphical commands, video codec data, picture codec data and pass-through data. The graphical output is divided into a plurality of regions, and the graphical output associated with each region is converted into at least one of: graphical commands, video codec data, picture codec data and pass-through data. The graphical output includes full-motion video, wherein the full-motion video is enclosed within one of the plurality of regions.

The specific embodiments described in this document represent examples or embodiments of the present invention, and are illustrative in nature rather than restrictive. In the above description, for purposes of explanation, numerous specific details are set forth in order to provide a thorough understanding of the invention. It will be apparent, however, to one skilled in the art that the invention can be practiced without these specific details.

Reference in the specification to "one embodiment" or "an embodiment" or "some embodiments" means that a particular feature, structure, or characteristic described in connection with the embodiment is included in at least one embodiment of the present invention. Features and aspects of various embodiments may be integrated into other embodiments, and embodiments illustrated in this document may be implemented without all of the features or aspects illustrated or described. It will be appreciated to those skilled in the art that the preceding examples and embodiments are exemplary and not limiting.

While the system, apparatus and method have been described in terms of what are presently considered to be the most practical and effective embodiments, it is to be understood that the disclosure need not be limited to the disclosed embodiments. It is intended that all permutations, enhancements, equivalents, combinations, and improvements thereto that are apparent to those skilled in the art upon a reading of the specification and a study of the drawings are included within the true spirit and scope of the present invention. The scope of the disclosure should thus be accorded the broadest interpretation so as to encompass all such modifications and similar structures. It is therefore intended that the application includes all such modifications, permutations and equivalents that fall within the true spirit and scope of the present invention.

What is claimed is:

1. A system for providing a low-latency transfer protocol, the system comprising:
    a server in communication with at least one client over a digital computer network;
    an application program instantiated on the server, wherein the application provides computer-generated output;
    wherein the server is configured to implement the low-latency transfer protocol including being configured to:
        intercept the computer-generated output from the application program;
        identify a plurality of regions within the computer generated output from the application program;
        for each specific region of the plurality of regions, determine and select a specific format tending to decrease latency in network transmission from a plurality of formats including pass-through, graphical commands, and video, the selected format selected based on criteria balancing network performance against display performance;
        for each specific region, converting corresponding computer generated output from the application program into the corresponding selected specific format, thereby generating a converted output of one or more different formats from the computer generated output; and
        transmit the converted output over the digital computer network to the at least one client.

2. The system of claim 1, wherein the server is further configured to execute a congestion control module for minimizing latency and optimizing use of available bandwidth.

3. The system of claim 1,
    wherein the at least one client is configured to
        execute, decode, and render graphics and video;
        render the graphical output in response to receiving transmitted converted output;
        intercept user inputs; and
    transmit the intercepted user inputs to the server over the network.

4. The system of claim 3, wherein the server is further configured to
    receive the intercepted user inputs from the client, and
    provide the intercepted user inputs to the application for processing.

5. The system of claim 4, wherein the server is further configured to smooth border areas between the plurality of regions.

6. The system of claim 1, wherein the graphical commands are represented by a universal intermediary graphical command language.

7. The system of claim 6, wherein the server is further configured to convert the graphical output into video codec data utilizing at least one of a localized motion detection routine and a motion estimation routine, wherein the server divides the graphical output into a plurality of region sets, each region set sharing similar motion characteristics.

8. The system of claim 7, wherein the server is configured to compute a motion score for each region set, wherein the motion scores represent motion characteristics.

9. The system of claim 1, wherein the server is further configured to pre-process the graphical output before converting by selecting regions with graphical activity for processing.

10. The system of claim 9, wherein the pre-processing further includes overlaying a mask on the graphical output to obscure static regions.

11. A server computer system implementing a low latency transfer protocol, the server computer system comprising:
    a server in communication with at least one client over a digital computer network; an application program instantiated on the server, wherein the application provides computer-generated output; wherein the server is configured to implement the low-latency transfer protocol including being configured to: intercept the computer-generated output from the application program;
    identify a plurality of regions within the computer generated output from the application program;
    for each specific region of the plurality of regions, determine and select a specific format tending to decrease latency in network transmission from a plurality of formats including pass-through, graphical commands, and video, the selected format selected based on criteria balancing network performance against display performance; for each specific region, converting corresponding computer generated output from the application program into the corresponding selected specific format, thereby generating a converted output of one or more different formats from the computer generated output; and
    transmit the converted output over the digital computer network to the at least one client.

* * * * *